(12) United States Patent
Lacey et al.

(10) Patent No.: US 7,993,950 B2
(45) Date of Patent: Aug. 9, 2011

(54) SYSTEM AND METHOD OF ENCAPSULATION

(75) Inventors: Joseph Damian Gordon Lacey, Milpitas, CA (US); Mickael Renault, San Jose, CA (US); Vikram Joshi, Mountain View, CA (US); James F. Bobey, Morgan Hill, CA (US); Robertus P. Van Kampen, s-Hertogenbosch (NL)

(73) Assignee: Cavendish Kinetics, Ltd., Hertfordshire (GB)

( * ) Notice: Subject to any disclaimer, the term of this patent is extended or adjusted under 35 U.S.C. 154(b) by 231 days.

(21) Appl. No.: 12/266,457

(22) Filed: Nov. 6, 2008

(65) Prior Publication Data

US 2009/0275163 A1 Nov. 5, 2009

Related U.S. Application Data

(60) Provisional application No. 61/126,072, filed on Apr. 30, 2008.

(51) Int. Cl.
*H01L 21/00* (2006.01)
*H01L 21/76* (2006.01)

(52) U.S. Cl. ............. 438/51; 438/52; 438/55; 438/422; 257/618; 257/E23.183

(58) Field of Classification Search ............ 438/50–55, 438/422; 257/618, E23.183
See application file for complete search history.

(56) References Cited

U.S. PATENT DOCUMENTS

| | | | |
|---|---|---|---|
| 4,761,219 A | 8/1988 | Sasaki et al. | |
| 5,270,264 A | 12/1993 | Andideh et al. | |
| 5,279,669 A | 1/1994 | Lee | |
| 5,292,370 A | 3/1994 | Tsai et al. | |
| 5,346,578 A | 9/1994 | Benzing et al. | |
| 5,504,026 A | 4/1996 | Kung | |
| 5,589,082 A * | 12/1996 | Lin et al. | 216/2 |
| 5,614,055 A | 3/1997 | Fairbairn et al. | |
| 5,872,058 A | 2/1999 | Van Cleemput et al. | |
| 5,919,548 A | 7/1999 | Barron et al. | |
| 6,012,336 A | 1/2000 | Eaton et al. | |

(Continued)

FOREIGN PATENT DOCUMENTS

DE 10056716 A1 5/2002

(Continued)

OTHER PUBLICATIONS

Notification of Reasons for Rejection dated Feb. 17, 2009 for Japanese Patent Application No. 2006-546296 (CK004JP) and English translation thereof.

(Continued)

*Primary Examiner* — Hsien-ming Lee
(74) *Attorney, Agent, or Firm* — Patterson & Sheridan, LLP

(57) ABSTRACT

Embodiments discussed herein generally include methods of fabricating MEMS devices within a structure. The MEMS device may be formed in a cavity above the structure, and additional metallization may occur above the MEMS device. The cavity may be formed by depositing an encapsulating layer over the sacrificial layers that enclose the MEMS device. The encapsulating layer may then be etched to expose portions of the sacrificial layers. The sacrificial layers are exposed because they extend through the sidewalls of the encapsulating layer. Therefore, no release holes are etched through the top of the encapsulating layer. An etchant then removes the sacrificial layers to free the MEMS device and form the cavity and an opening through the sidewall of the encapsulating layer. Another encapsulating layer may then be deposited to seal the cavity and the opening.

18 Claims, 20 Drawing Sheets

U.S. PATENT DOCUMENTS

| | | | |
|---|---|---|---|
| 6,051,121 A | 4/2000 | Givens et al. | |
| 6,174,820 B1 | 1/2001 | Habermehl et al. | |
| 6,174,850 B1 | 1/2001 | Michaud | |
| 6,391,150 B1 | 5/2002 | Berger et al. | |
| 6,395,150 B1 | 5/2002 | Van Cleemput et al. | |
| 6,635,509 B1 | 10/2003 | Ouellet | |
| 6,861,277 B1 | 3/2005 | Monroe et al. | |
| 6,936,494 B2 | 8/2005 | Cheung | |
| 7,008,812 B1* | 3/2006 | Carley | 438/52 |
| 7,163,896 B1 | 1/2007 | Zhu et al. | |
| 7,211,525 B1 | 5/2007 | Shanker et al. | |
| 7,235,281 B2 | 6/2007 | Rusu et al. | |
| 7,329,586 B2 | 2/2008 | Vellaikal et al. | |
| 7,344,996 B1 | 3/2008 | Lang et al. | |
| 2001/0023991 A1 | 9/2001 | Kakuhara | |
| 2002/0011645 A1 | 1/2002 | Bertin et al. | |
| 2002/0064906 A1 | 5/2002 | Enquist | |
| 2002/0193037 A1 | 12/2002 | Hofmann et al. | |
| 2003/0001221 A1 | 1/2003 | Fischer et al. | |
| 2003/0138986 A1 | 7/2003 | Bruner | |
| 2003/0148550 A1 | 8/2003 | Volant et al. | |
| 2003/0153116 A1* | 8/2003 | Carley et al. | 438/53 |
| 2004/0157426 A1 | 8/2004 | Ouellet et al. | |
| 2004/0159532 A1 | 8/2004 | Tatic-Lucic et al. | |
| 2004/0166603 A1* | 8/2004 | Carley | 438/52 |
| 2004/0188785 A1 | 9/2004 | Cunningham et al. | |
| 2004/0245588 A1 | 12/2004 | Nikkel et al. | |
| 2005/0017313 A1 | 1/2005 | Wan | |
| 2005/0037608 A1 | 2/2005 | Andricacos et al. | |
| 2005/0164127 A1 | 7/2005 | Reid et al. | |
| 2006/0108675 A1 | 5/2006 | Colgan et al. | |
| 2006/0134825 A1 | 6/2006 | DCamp et al. | |
| 2006/0220173 A1 | 10/2006 | Gan et al. | |
| 2007/0004096 A1* | 1/2007 | Heuvelman | 438/127 |
| 2008/0308920 A1* | 12/2008 | Wan | 257/685 |

FOREIGN PATENT DOCUMENTS

| | | |
|---|---|---|
| EP | 751546 A2 | 1/1997 |
| EP | 783182 A2 | 7/1997 |
| EP | 1041629 A1 | 10/2000 |
| EP | 1450406 A1 | 8/2004 |
| FR | 2874213 A1 | 2/2006 |
| JP | 63-198378 | 8/1988 |
| JP | 63-307758 A | 12/1988 |
| JP | 05-297413 | 11/1993 |
| JP | 09-257618 | 10/1997 |
| JP | 11-177067 | 7/1999 |
| JP | 2000-186931 | 7/2000 |
| JP | 2001-133703 | 5/2001 |
| JP | 2002-280470 | 9/2002 |
| JP | 2003-035874 | 2/2003 |
| JP | 2003-506871 | 2/2003 |
| WO | WO-97/07517 A2 | 2/1997 |
| WO | WO-00/24021 A1 | 4/2000 |
| WO | WO-00/33089 A2 | 6/2000 |
| WO | WO-01/31664 A1 | 5/2001 |
| WO | WO-01/56066 A1 | 8/2001 |
| WO | WO-01/83363 A1 | 11/2001 |
| WO | WO-01/92842 A2 | 12/2001 |
| WO | WO-02/16150 A1 | 2/2002 |
| WO | WO-02/063657 A2 | 8/2002 |
| WO | WO-03/028059 A1 | 4/2003 |
| WO | WO-03/069645 A1 | 8/2003 |
| WO | WO-03/085719 | 10/2003 |
| WO | WO-2004/096696 A1 | 11/2004 |
| WO | WO-2005/060002 A1 | 6/2005 |
| WO | WO-2005/061376 A1 | 7/2005 |
| WO | WO-2006/077565 A1 | 7/2006 |
| WO | WO-2007/015097 A1 | 2/2007 |
| WO | WO-2007/017672 A1 | 2/2007 |
| WO | WO-2007/060414 A1 | 5/2007 |
| WO | WO-2007/060416 A1 | 5/2007 |

OTHER PUBLICATIONS

Notification of the First Office Action for Chinese Patent Application No. 200480039028.0 (CK004-China) dated Feb. 27, 2009.

Office Action for European Patent Application No. 04805944.8 dated Jun. 22, 2009 (CK004EP).

Chan, et al., "Comprehensive Static Characterization of Vertical Electrostatically Actuated Polysilicon Beams", vol. 16, No. 4, Oct. 1999, pp. 58-65.

International Preliminary Report and Written Opinion for International Application No. PCT/GB2006/2959 dated Feb. 5, 2008.

International Preliminary Report and Written Opinion for International Application No. PCT/GB2006/004350 dated May 27, 2008.

International Preliminary Report and Written Opinion for International Application No. PCT/GB2006/004354 dated May 27, 2008.

International Preliminary Report on Patentability for International Application No. PCT/GB2004/005122 dated Nov. 16, 2005.

International Preliminary Report on Patentability for International Application No. PCT/GB2004/001773 dated Jun. 22, 2008.

International Search Report for International Application No. PCT/GB2006/004354 dated Mar. 12, 2007.

International Search Report for International Application No. PCT/GB2006/002959 dated Oct. 25, 2006.

International Search Report for International Application No. PCT/GB2006/004350 dated Mar. 12, 2007.

International Search Report for International Application No. PCT/GB2004/005122 dated Mar. 2, 2005.

International Search Report for International Application No. PCT/GB2004/001773 dated Sep. 6, 2004.

Mercado et al., "A mechanical approach to overcome RF MEMS switch stiction problem", vol. conf. 53, dated May 27, 2003, pp. 377-384.

Written Opinion for International Application No. PCT/GB2004/001773 dated Sep. 6, 2004.

Written Opinion for International Application No. PCT/GB2004/005122 dated Feb. 28, 2005.

Zavracky et al., "Micromechanical Switches Fabricated Using Nickel Surface Micromachining", Journal of Microelectromechanical Systems, IEEE Service Center, Piscataway, NJ, US, vol. 6, No. 1, dated Mar. 1997.

Liu et al., "Sealing of micro machined cavities using chemical vapour deposition methods: characterisation and optimisation", J. MEMS, 8, pp. 135-145, 1999.

Logan, "RF Diode Sputter Etching and Deposition," Handbook of Plasma Processing Technology, pp. 140-159.

Park et al., "Wafer-scale film encapsulation of micromachined accelerometers", The 12th Int. Conf. on Solid State Sensors, Actuators and Microsystems, Boston, Jun. 8-12, 2003, pp. 1903-1906.

Stahl et al., "Thin film encapsulation of acceleration sensors using polysilicon sacrificial layers", The 12th int. Conf. on Solid State Sensors, Actuators and Microsystems, Boston, Jun. 8-12, 2003, pp. 1899-1902.

International search report and written opinion for PCT/US2009/042028 (CK056PCT) dated May 4, 2010.

* cited by examiner

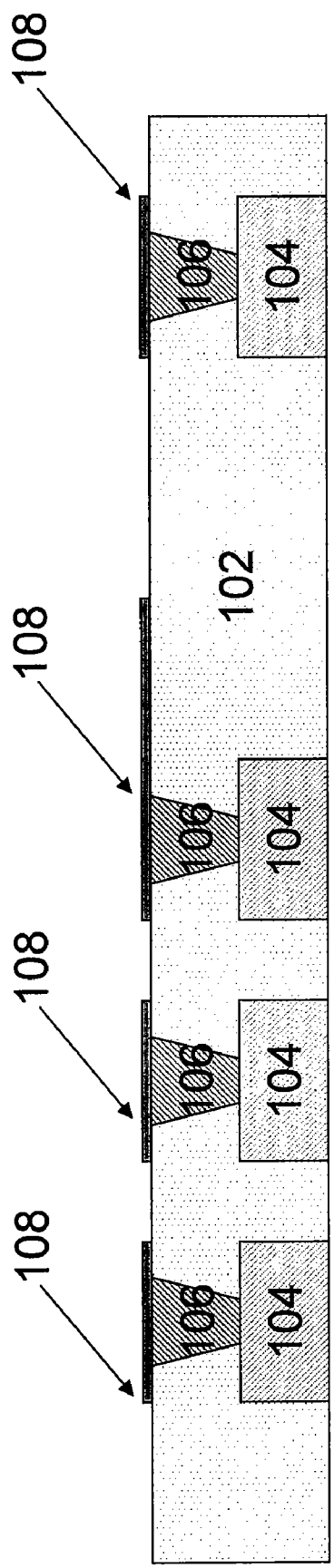
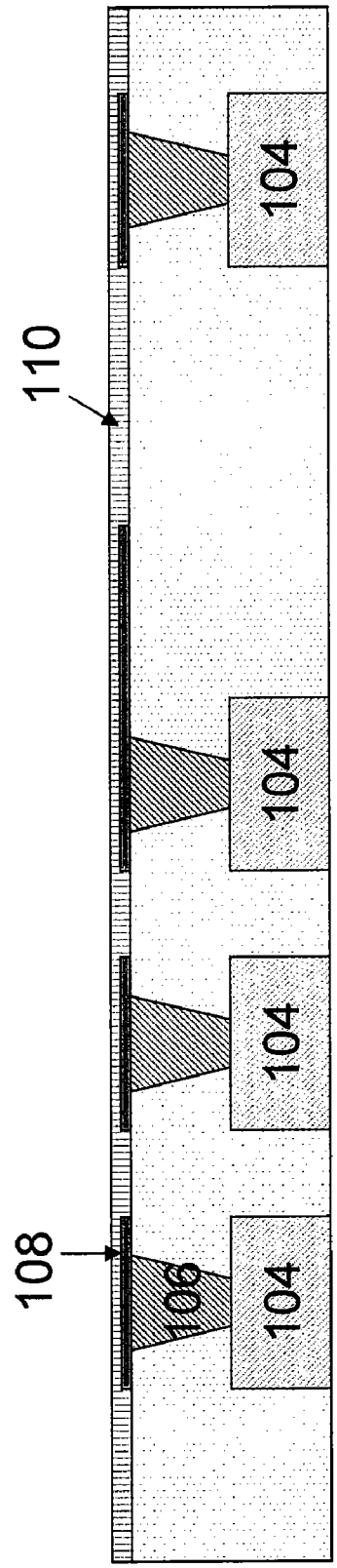

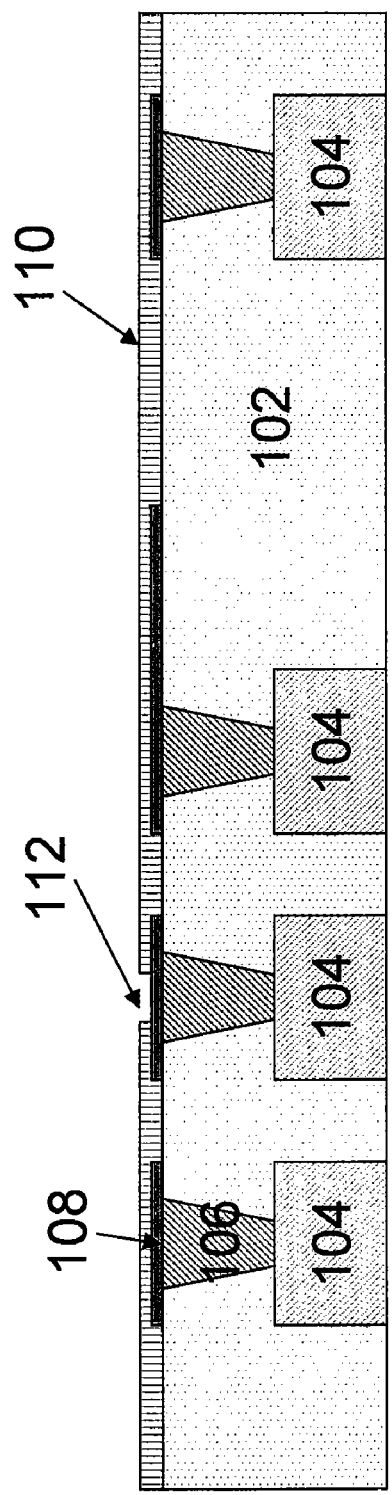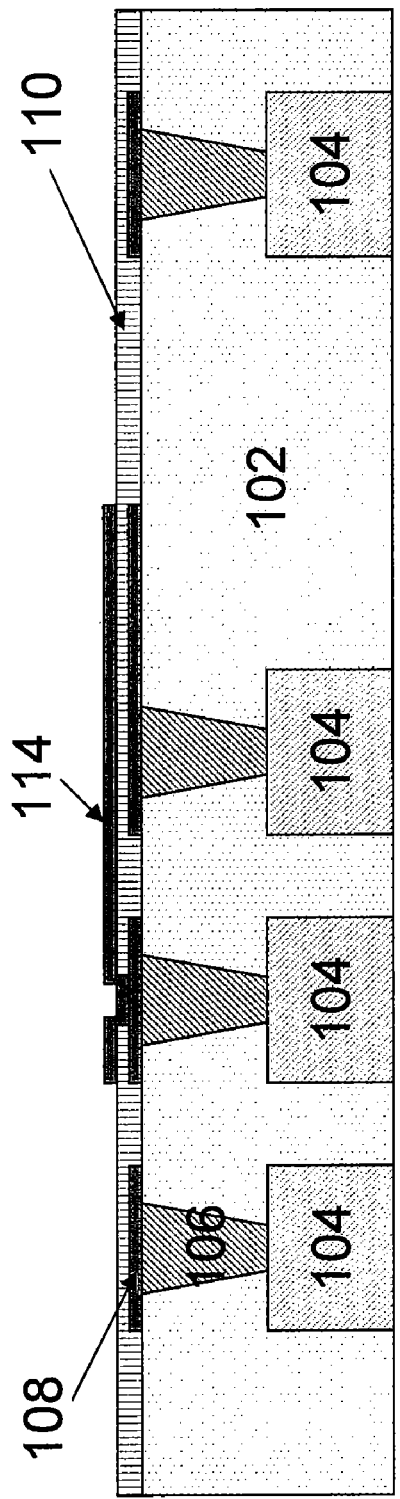
Figure 1C
Figure 1D

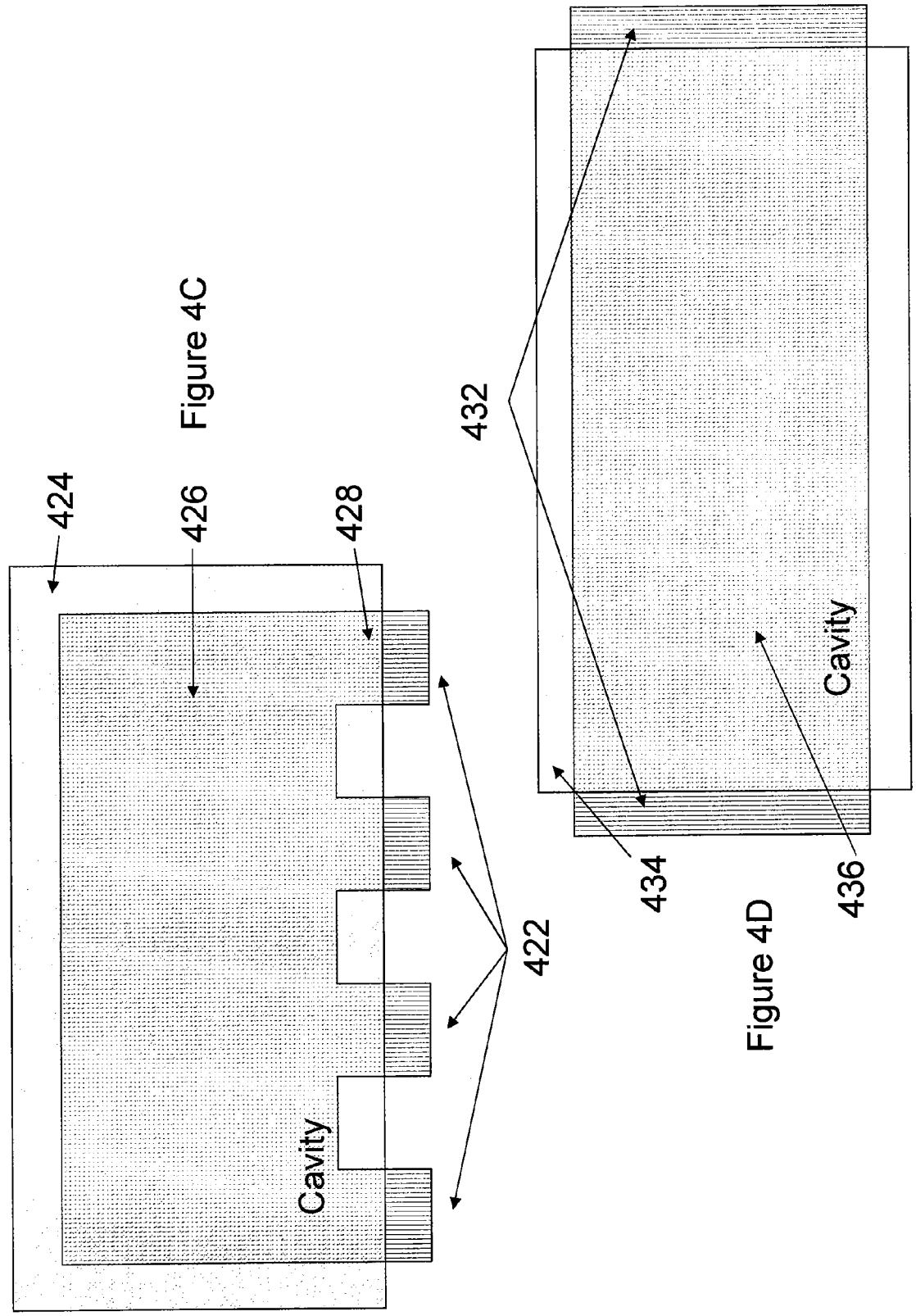

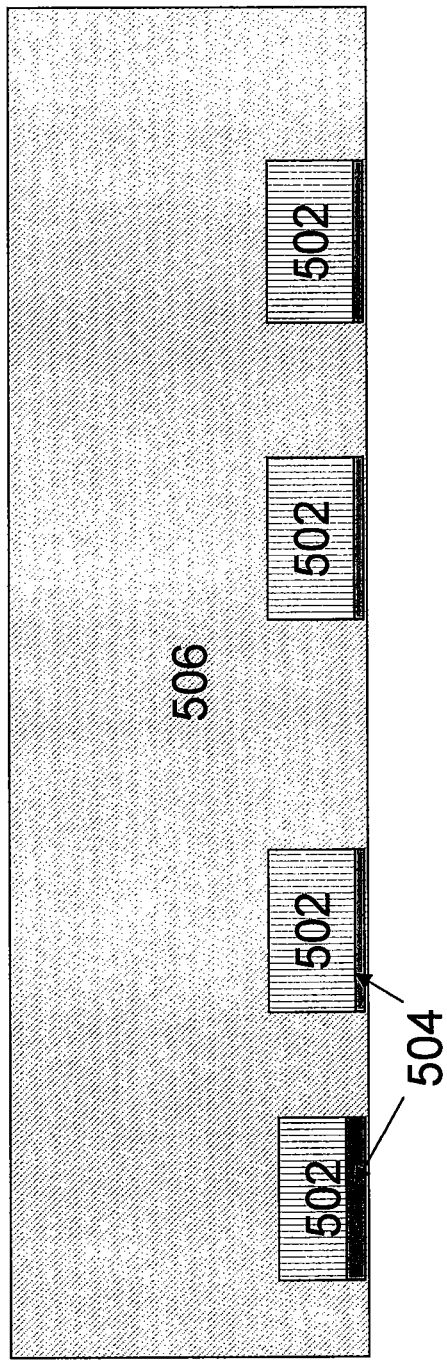
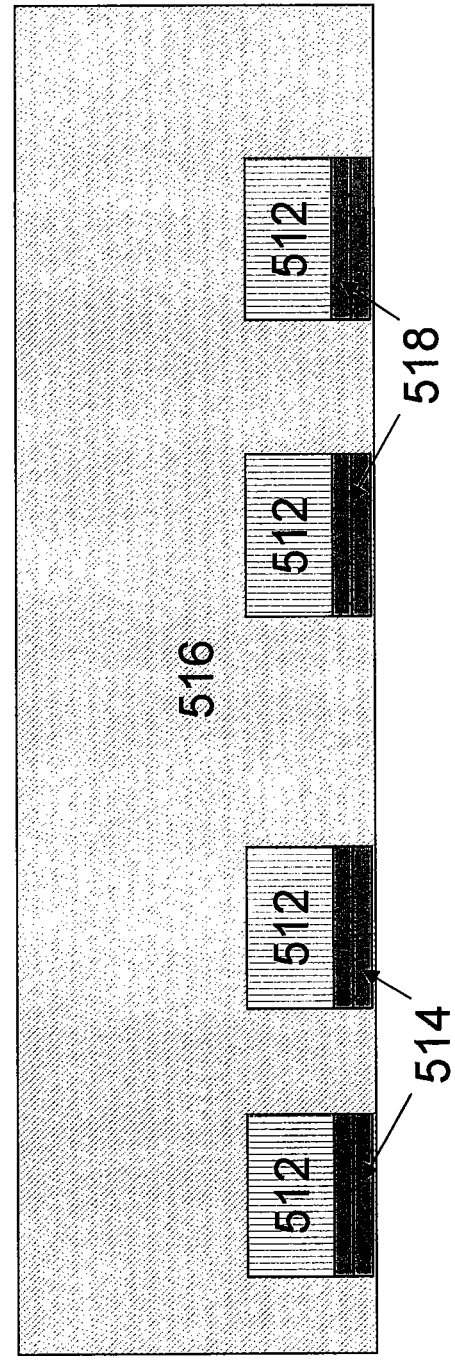

SYSTEM AND METHOD OF ENCAPSULATION

CROSS-REFERENCE TO RELATED APPLICATIONS

This application claims benefit of U.S. Provisional Patent Application Ser. No. 61/126,072, filed Apr. 30, 2008, which is herein incorporated by reference.

BACKGROUND OF THE INVENTION

1. Field of the Invention

Embodiments of the present invention generally relate to a method of encapsulating a micro-electromechanical system (MEMS) device, and the device formed thereby.

2. Description of the Related Art

Typical MEMS devices are fabricated as stand alone components which are separately packaged, they can then be coupled with separate microcontroller ships to add functionality. More recently there has been a move to couple these MEMS devices onto a complementary metal-oxide semiconductor (CMOS) by building the MEMS elements on separate wafers and then attaching them to CMOS wafers. This manufacturing method is complex and time consuming in that several steps are necessary to ensure that the MEMS devices are properly bolted onto the CMOS wafer and properly sealed to protect the MEMS device from the environment.

In order to address this problem, methods of encapsulating MEMS devices directly onto CMOS wafers using BEOL processes have been developed. Typically, these methods comprise layering a MEMS device between two sacrificial layers and covering the top sacrificial layer with an insulating layer. After the insulating layer is deposited, release holes are created in the insulting layer and a gas etching process is used to remove the sacrificial layers surrounding the MEMS device, thereby defining a cavity in which the MEMS device is contained.

A problem with these methods is that, in order to remove the sacrificial layers, it is necessary to create release holes using complex masking steps. The use of such extra steps increases the overall complexity of the CMOS process and, ultimately, the cost of the resulting device.

Therefore, there is a need for a method of encapsulating MEMS devices in a CMOS BEOL process without having to create release holes in a deposited insulating layer, and devices formed thereby.

SUMMARY OF THE INVENTION

Embodiments of the present invention generally include methods of fabricating MEMS devices. The MEMS device may be formed at any point within the structure. For example, the MEMS device may be formed above the CMOS structure. Additionally, the MEMS device may be formed within a stack such that additional layers of the structure (i.e., not the MEMS device) may be present above the MEMS device. The MEMS device may be used in the back end of line (BEOL) processing of a metal system. The MEMS device may also be formed in the back end of line of any other semiconductor front end technology, such as a bipolar process, or a bi-CMOS, or a SiGe, or a GaAs, GaAlAs or other III/V or II/VI, or any other front end semiconductor process. Additional metallization may occur above the MEMS device. The cavity may be formed by depositing an encapsulating layer over the sacrificial layers that enclose the MEMS device. The encapsulating layer may then be etched to expose portions of the sacrificial layers. The sacrificial layers are exposed because they extend through the sidewalls of the encapsulating layer. Therefore, no release holes are etched through the top of the encapsulating layer. An etchant then removes the sacrificial layers to free the MEMS device and form the cavity and an opening through the sidewall of the encapsulating layer. Another encapsulating layer may then be deposited to seal the cavity and the opening.

In one embodiment, a method for encapsulating a device is disclosed. The method includes depositing one or more sacrificial layers over a substrate and depositing a first encapsulating layer over the one or more sacrificial layers. The first encapsulating layer may be in contact with the substrate. The method may further include etching the first encapsulating layer to expose a first portion of the one or more sacrificial layers and to form a first encapsulating sidewall extending from a top of the first encapsulating layer to the substrate. After the etching, the one or more sacrificial layers may extend beyond the first encapsulating sidewall. The method may also include etching the one or more sacrificial layers to form an opening between the first encapsulating layer and the substrate and a first cavity between the substrate, the first encapsulating layer, and the first encapsulating sidewall. The method may additionally include depositing a second encapsulating layer over the first encapsulating layer to seal the opening.

In another embodiment, a method of encapsulating a device is disclosed. The method includes depositing one or more sacrificial layers over a substrate and depositing a first encapsulating layer over the one or more sacrificial layers. The first encapsulating layer may have a top surface and sidewalls extending between the top surface and a top surface of the substrate. The first encapsulating layer may also have one or more openings therethrough with at least one opening having a first portion of the one or more sacrificial layers extending therethrough and beyond a respective sidewall. The method may also include removing the one or more sacrificial layers to form a cavity between the top surface of the first encapsulating layer, the sidewalls of the first encapsulating layer, and the top surface of the structure. The method may additionally include depositing a second encapsulating layer over the first encapsulating layer to seal each of the at least one openings.

In another embodiment, a method of encapsulating a device is disclosed. The method includes depositing a first sacrificial layer over the structure, depositing a second sacrificial layer over the first sacrificial layer, and etching the second sacrificial layer and the first sacrificial layer to form a patterned first sacrificial layer and a patterned second sacrificial layer. At least one of the patterned first sacrificial layer and the patterned second sacrificial layer may have a first portion and one or more second portions extending from the first portion. The method may also include depositing a first encapsulating layer over the second sacrificial layer. The first encapsulating layer may be in contact with the structure, the patterned second sacrificial layer and the one or more second portions. The method may additionally include etching the first encapsulating layer to expose a top surface of the one or more second portions and etching the patterned second sacrificial layer and the patterned first sacrificial layer to form a cavity between the first encapsulating layer and the structure and one or more openings through the first encapsulating layer at an area corresponding to the one or more second portions. The method may also include depositing a second encapsulating layer over the first encapsulating layer and the one or more openings to seal the cavity, the second encapsulating layer bordering the cavity.

In another embodiment, a method of encapsulating a device above a structure is disclosed. The method includes forming one or more electrodes on one or more metal contacts of the structure, depositing a first sacrificial layer over the structure, and depositing a first encapsulating layer over the first sacrificial layer. The first encapsulating layer may have a top surface and sidewalls that extend from the top surface to the structure. The sidewalls may have one or more openings therethrough that expose the first sacrificial layer. Additionally, the first encapsulating layer may be in contact with the one or more electrodes. The method may also include introducing an etchant through the one or more openings, etching the first sacrificial layer to form a cavity between the first encapsulating layer and the structure, and depositing a second encapsulating layer over the first encapsulating layer and the one or more openings to seal the cavity.

In another embodiment, a method of encapsulating a device above a structure is disclosed. The method may include forming one or more electrodes on one or more metal contacts of the structure, depositing a first sacrificial layer over the structure, and depositing an electrically conductive encapsulating layer over the first sacrificial layer. The electrically conductive encapsulating layer may have a top surface and sidewalls that extend from the top surface to the structure. The electrically conductive encapsulating layer may be in contact with at least one of the one or more electrodes. The method may also include etching the electrically conductive encapsulating layer to expose a portion of the first sacrificial layer through the sidewalls, introducing an etchant through the one or more openings, etching the first sacrificial layer to form a cavity between the electrically conductive encapsulating layer and the structure, and depositing a dielectric layer over the electrically conductive encapsulating layer and the one or more openings to seal the cavity.

In another embodiment, a method of encapsulating a device above a structure is disclosed. The method may include forming one or more electrodes on one or more metal contacts of the structure, depositing a first sacrificial layer over the structure, depositing a second sacrificial layer over the first sacrificial layer, and depositing a first encapsulating layer over the second sacrificial layer and the one or more electrodes. The method may also include etching the first encapsulating layer to expose at least a portion of the first sacrificial layer, introducing an etchant through a sidewall of the first encapsulating layer, etching the first sacrificial layer and the second sacrificial layer to create a cavity between the first encapsulating layer and the structure, and sputter depositing or otherwise a second encapsulating layer over first encapsulating layer to seal the cavity.

In another embodiment, a semiconductor device may include a substrate, one or more electrodes electrically coupled to the substrate, and a first encapsulating layer formed over the substrate and in contact with the one or more electrodes. The first encapsulating layer may be spaced from the substrate to form a cavity therebetween. Additionally, the first encapsulating layer may have sidewalls with one or more openings therethrough to the cavity. The device may also include a second encapsulating layer formed over the first encapsulating layer and sealing the openings.

In another embodiment, a semiconductor device may include a complementary metal oxide semiconductor structure and a first encapsulating layer formed over the structure and spaced from the structure to form a cavity therebetween. The first encapsulating layer may have sidewalls extending between a top surface and the structure with one or more openings extending through the sidewalls. The device may also include a second encapsulating layer formed over the first encapsulating layer and the one or more openings, the second encapsulating layer in contact with the structure.

In another embodiment, a semiconductor device may include a plurality of first metal interconnects disposed in a first dielectric layer, a plurality of first vias disposed within the first dielectric layer and filled with metal, and a first electrode coupled with one of the first vias of the plurality of first vias. The device may also include a first encapsulating layer coupled with the first dielectric layer and enclosing a first cavity, the first electrode, the first encapsulating layer having sidewalls with at least one opening therethrough. The device may also include a second dielectric layer disposed over the first encapsulating layer and sealing the at least one opening, a plurality of second metal interconnect coupled with the first vias, and a plurality of second vias disposed within the second dielectric layer and filled with metal. The plurality of second vias may extend above the first cavity. A second electrode may be coupled with one of the second vias of the plurality of second vias. A second encapsulating layer may be coupled with the second dielectric layer and enclosing a second cavity. Additionally, a third encapsulating layer may be disposed over the second encapsulating layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1I show of an encapsulation method in accordance with an embodiment of the present invention.

FIG. 4C shows a single sided, multi tab release channels in accordance with an embodiment of the present invention.

FIG. 4D shows a dual ended release channel in accordance with an embodiment of the present invention.

FIG. 5A represents a single layered metal blocking structure in accordance with an embodiment of the present invention.

FIG. 5B represents a double layered metal blocking structure in accordance with an embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1E:
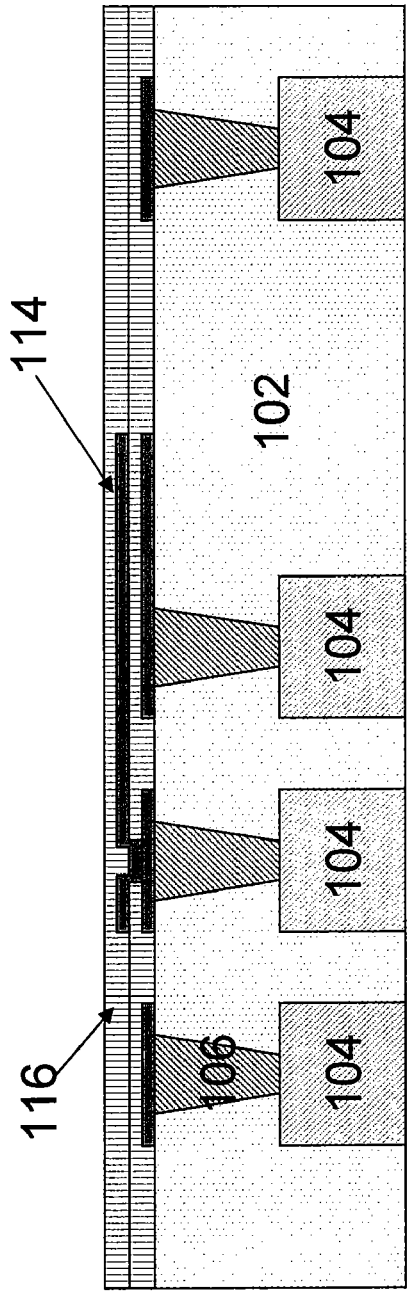

Embodiments will be described herein with reference to methods of fabricating MEMS devices within a structure. The MEMS device may be formed at any point within the structure. For example, the MEMS device may be formed above a CMOS structure. Additionally, the MEMS device may be formed within a stack such that additional layers of the structure (i.e., not the MEMS device) may be present above the MEMS device. The MEMS device may be used in the BEOL processing of a metal system. In addition it could be formed in the BEOL of a bipolar process or a III/V or II/IV system. The MEMS device may be formed in a cavity above the CMOS BEOL structure, and additional metallization may occur above the MEMS device. The cavity may be formed by depositing an encapsulating layer over the sacrificial layers that enclose the MEMS device. The encapsulating layer may then be etched to expose portions of the sacrificial layers. The sacrificial layers are exposed because they extend through the sidewalls of the encapsulating layer. Therefore, no release holes are etched through the top of the encapsulating layer. An etchant then removes the sacrificial layers to free the MEMS device and form the cavity and an opening through the sidewall of the encapsulating layer. Another encapsulating layer may then be deposited to seal the cavity and the opening.

With reference to FIGS. 1A-1I, a first embodiment of the present invention will now be described. The method in accordance with the first embodiment of the present invention relates to the fabrication of a micro-cavity within a 180 nm aluminum CMOS BEOL. In order to describe how to connect an element within the micro-cavity to a circuit outside the micro-cavity, the embodiment described hereafter comprises a MEMS cantilever. As will be appreciated, any other suitable device could be encapsulated in the micro-cavity. As will also be appreciated, the embodiment described hereafter can be fabricated in any aluminum BEOL that employs Chemical-Mechanical Planarization (CMP) of Inter-metal Dielectric (IMD) films.

FIG. 1A shows the result of the first step of a method in accordance with the present invention. The first step consists of using known CMOS process steps to fabricate a wafer up to a predetermined metal level within the aluminum CMOS BEOL. The CMOS BEOL comprises an inter-metal dielectric layer 102 having metal channels 104 therein. In one embodiment, the dielectric layer 102 may comprise silicon dioxide. The vias 106 are fabricated using known methods such as conventional lithography and etch processes. The vias 106 may comprise a liner layer and a metal fill. In one embodiment, the liner may comprise titanium. In another embodiment, the liner may comprise titanium nitride. In one embodiment, the fill material may comprise tungsten. In another embodiment, the fill material may comprise copper. In another embodiment, the fill material may comprise aluminum. The vias 106 may be capped with a titanium and/or titanium nitride layer. The titanium and/or titanium nitride layer may be patterned using conventional lithography and etch processes to form a plurality of electrodes 108, one of which will be the lower electrode of the MEMS cantilever device.

FIG. 1B shows the result of the second step of the method. This step comprises coating the lower half of the first sacrificial layer 110 on the wafer surface over the patterned electrodes 108. As this layer is the first sacrificial layer 110, its thickness will be chosen to permit the operation of the device within the resulting cavity. In one embodiment, the first sacrificial layer 110 may have a thickness between about 30 nm and about 500 nm. The first sacrificial layer 110 may comprise a high temperature spin-on organic film. However, other spin-on films and Plasma Enhanced Chemical Vapor Deposition (PECVD) materials, such as silicon nitride, silicon dioxide, amorphous silicon and amorphous carbon, can be employed to the same effect. A spin on first sacrificial layer 110 may flow over any irregularities in the underlying layers, thereby producing a flat layer where the thickness of the film depends on the height of the underlying material.

FIG. 1C shows the result of the third step of the method. The third step comprises the patterning of a via structure 112 in the first sacrificial layer 110 to form an interconnect from the underlying CMOS to the anchor point of the cantilever device. FIG. 1D shows the result of the fourth step of the method, which comprises the deposition of a conductive layer on top of the first sacrificial layer 110. In one embodiment, the conductive layer may comprise titanium nitride. In other embodiments, the conductive layer may comprise a titanium aluminum compound, a titanium aluminum nitride compound, polysilicon, silicon, any conductive material, and combinations thereof. In another embodiment this layer may be made of a combination of conducting and insulating parts. The conductive layer will form the cantilever of the cantilever device. Once deposited, the conductive layer may be patterned using conventional lithography and etch processes in order to form the shape of the cantilever 114. In one embodiment, the conductive layer is patterned by depositing a photoresist layer thereon, exposing the photoresist, developing the photoresist, removing the developed (or undeveloped photoresist) to form a mask, and then exposing the conductive layer through the mask to an etchant to remove undesired portions of the conductive layer. Thereafter, the mask may be removed. In one embodiment, a hard mask may be used.

FIG. 1E shows the result of the fifth step of the method, which comprises coating the wafer surface with the second sacrificial layer 116 in order to cover the patterned cantilever 114. The depositing of this second sacrificial layer 116 effectively seals the MEMS element prior to the creation of the micro-cavity. The second sacrificial layer 116 may be deposited in a manner similar to the method of depositing the first sacrificial layer 110. Additionally, the second sacrificial layer 116 may comprise one or more of a high temperature spin-on organic film, silicon nitride, silicon dioxide, amorphous silicon or amorphous carbon. In one embodiment, the second sacrificial layer 116 may comprise the same material as the first sacrificial layer 110. In another embodiment, the second sacrificial layer 116 may comprise a material different than the first sacrificial layer 110.

Figure 1F:
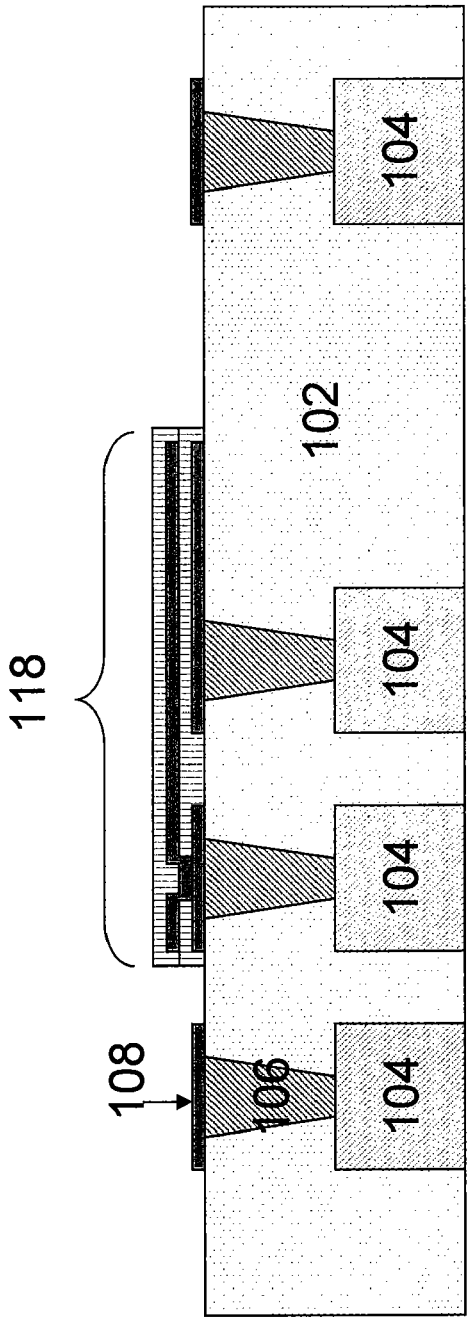

FIG. 1F shows the result of the sixth step of the method, which comprises the patterning of the first sacrificial layer 110 and the second sacrificial layer 116 in order to form shape of the micro-cavity 118. The shape and dimensions of the patterned micro-cavity 118 depend on the structure which is to be fabricated. The first sacrificial layer 110 and the second sacrificial layer 116 may be patterned by depositing conventional lithography and etching methods. For example, a photoresist layer may be deposited over the second sacrificial layer 116. Then, the photoresist may be exposed and developed. Thereafter, the developed (or undeveloped) photoresist may be removed to form a mask. Then the second sacrificial layer 116 may be exposed to an etchant through the mask to remove undesired portions of the second sacrificial layer 116. The first sacrificial layer 110 may be etched in the same step as the second sacrificial layer 116. For example, if the second sacrificial layer 116 and the first sacrificial layer 110 comprise the same material, the same etchant may be used. However, if different materials are used, then different etchants may be needed to etch the separate layers.

Figure 1G:
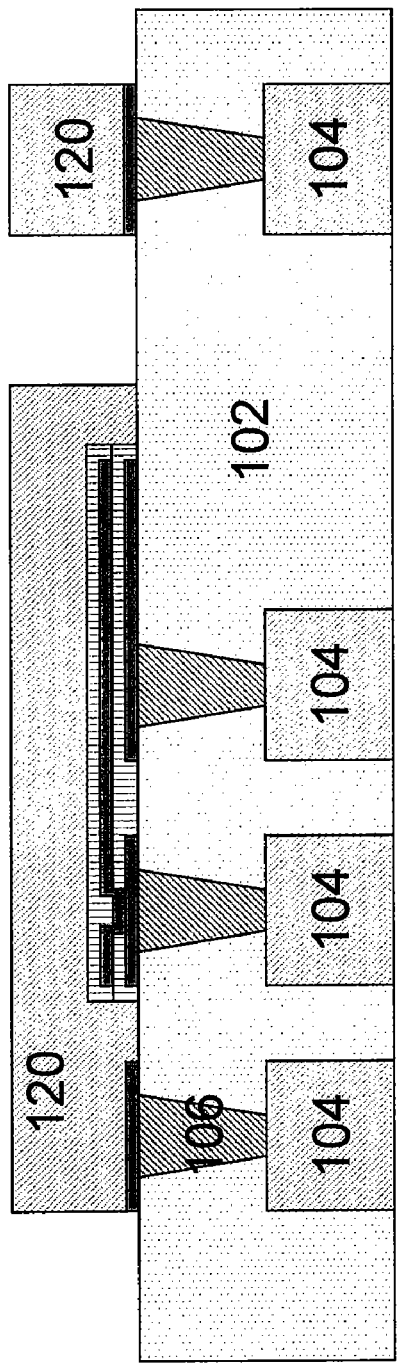

FIG. 1G shows the result of the seventh step of the method. In the step, the CMOS BEOL flow is continued and the next metal layer 120 is deposited. The metal layer 120 may be blanket deposited over the CMOS BEOL and the patterned second sacrificial layer 116 followed by an etching process. In one embodiment, the metal layer 120 may be pattern deposited through a mask. The metal layer 120 may be in contact with one or more electrodes 108 as well as the dielectric layer 102. Prior to patterning the metal layer 120, the metal layer 120 may encapsulate the micro-cavity 118. Once deposited, the metal layer 120 is then patterned and etched using conventional lithography and etch processes discussed above. Following the patterning and etching of the metal layer 120, the metal layer may be in contact with an electrode 108 outside of the cavity area 118 so provide the electrical connection to metallization layers to be formed above the micro-cavity 118. Additionally, the metal layer 120, after etching, may have one or more openings through the sidewalls that are filled with either the second sacrificial layer 116, the first sacrificial layer 110, or both. The opening in the sidewall permits an etchant to reach the micro-cavity 118 and remove the first and second sacrificial layers 110 and 116. In another embodiment, portions of either the second sacrificial layer 116, the first sacrificial layer 110, or both may extend beyond the sidewalls of the metal layer 120 as release tabs. The release tabs that may be used will be discussed below.

Figure 1H:
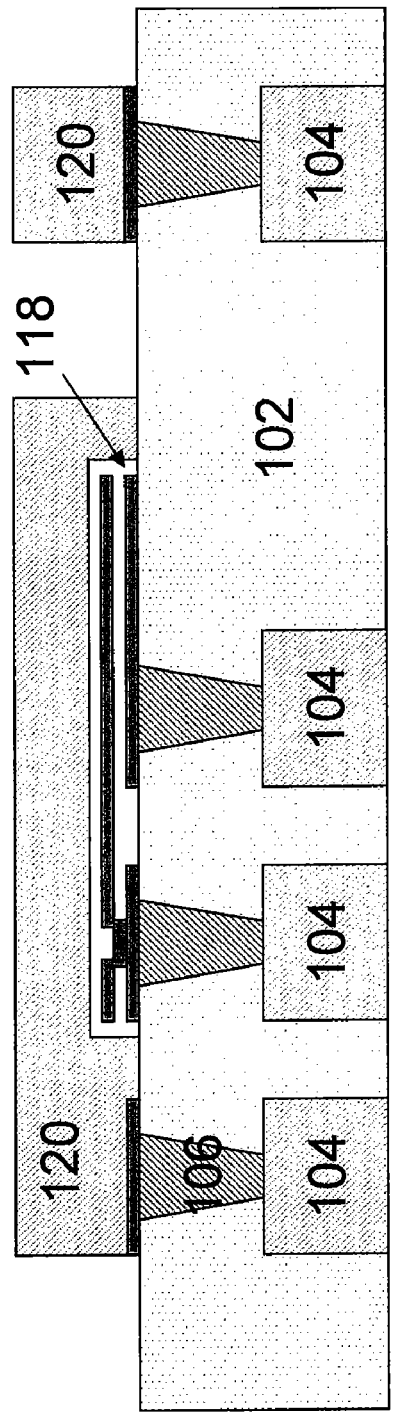

The result of the eight step of the method is shown in FIG. 1H. This step comprises the removal of the patterned sacrificial layer from the wafer surface in order to leave the free-standing MEMS device 122. In one embodiment, the first sacrificial layer 110 and the second sacrificial layer 116 may be removed using a dry plasma etch. In another embodiment, the first sacrificial layer 110 and the second sacrificial layer 116 may be removed using the same etchant. In another embodiment, the first sacrificial layer 110 and the second sacrificial layer 116 may be removed using different etchants. The etchants used to remove the first sacrificial layer 110 and the second sacrificial layer 116 may be the same etchants used to pattern the first sacrificial layer 110 and the second sacrificial layer 116. The etchant or etchants are delivered to the first sacrificial layer 110 and the second sacrificial layer 116 through the sidewalls of the metal layer 120 or directly to release tabs discussed below.

Figure 1I:
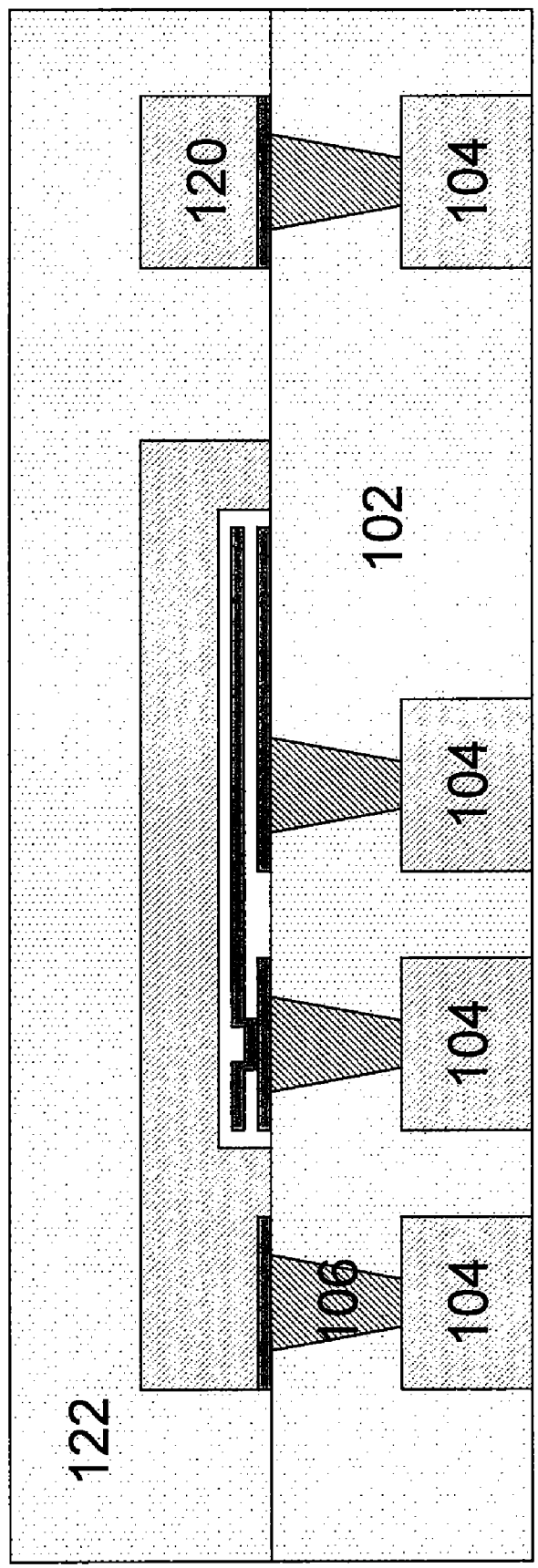

FIG. 1I shows the result of the ninth step of the method. This step comprises depositing an IMD or dielectric layer 122 in order to effectively seal the fabricated micro-cavity 118 within the CMOS BEOL. The dielectric layer 122 may comprise silicon dioxide. The dielectric layer 122 seals any openings into the micro-cavity 118 to encapsulate the cantilever. As will be appreciated, the final shape of the micro-cavity is dependent upon the structure which is to be contained within it. The height of the micro-cavity 118 is less than the total height of the dielectric layer 122 such that the micro-cavity 118 fits within the dielectric layer 122. Therefore, the micro-cavity 118 may be formed in a structure without altering the process flow for later metallization layers. By fitting the micro-cavity 118 within the dielectric layer 122, no additional processing above the dielectric layer 122 is necessary than would occur in absence of the micro-cavity 118. In some embodiments the cavity may take up a height of more than one interlayer dielectric where it lies on top of metal layer m and under metal layer m+2. The subsequent metal layers can then run on top undisturbed.

Figure 2:
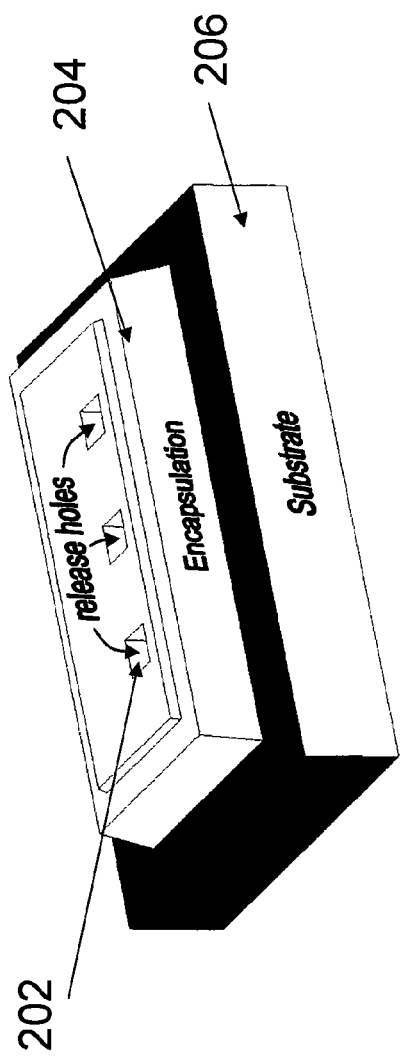
FIG. 2 represents a prior art embodiment of release holes in a structure.

FIG. 2 shows the result of a process in accordance with the prior art. Here vias 202 are patterned in the top of the cavity encapsulation layer 204 over the substrate 206, either at the same time as the cavity encapsulation layer 204 is formed or with a separate release hole mask. After the release etch is performed, the vias 202 are then sealed by depositing a layer of the seal material on top of the cavity encapsulation layer 204, thereby plugging the vias 202.

Figure 3:
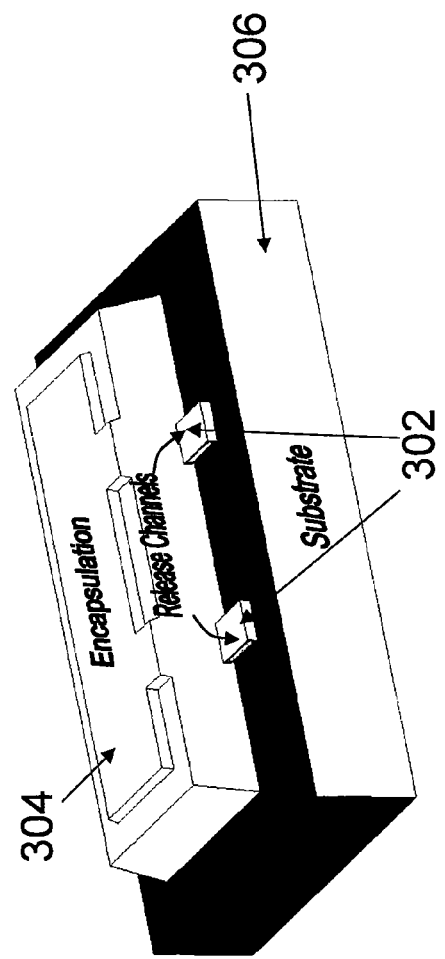
FIG. 3 represents an embodiment of how release tabs can be created in accordance with an embodiment of the present invention.

FIG. 3 shows the result of a process in accordance with one embodiment of the present invention. In this implementation, the sacrificial material is patterned in such a way as to leave release tabs 302 on the side of the cavity body which protrude from the cavity encapsulation layer 304 over the substrate 306. In this way lateral release channels are created in select locations which are positioned underneath the cavity encapsulation layer 304. The cavity encapsulation layer 304 is deposited and then etched to remove undesired portions of the cavity encapsulation layer 304 and leave portions of the cavity encapsulation layer 304 that will enclose the cavity. During patterning of the cavity encapsulation layer 304, the release channels are exposed because they extend beyond the final structure of structure of the cavity encapsulation layer 304. A release etch is then performed to remove the sacrificial layers. After the release etch is performed, the channels are then sealed by depositing a layer of seal material (as described in above) on the cavity encapsulation layer 304, thereby plugging the channels.

Figure 4B:
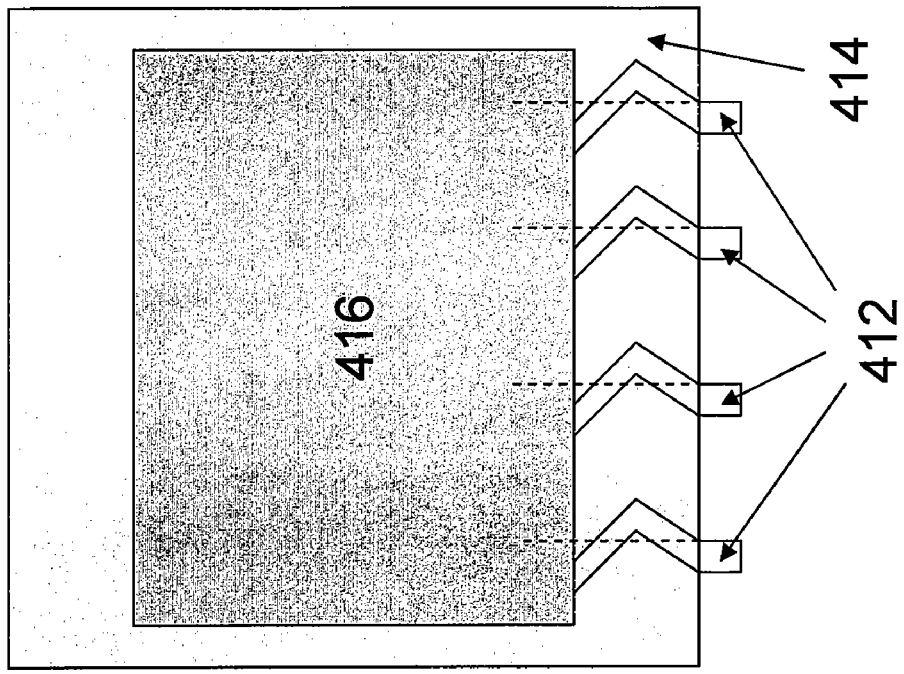
FIG. 4B represents dog-legged release tab structures in accordance with an embodiment of the present invention.
Figure 4A:
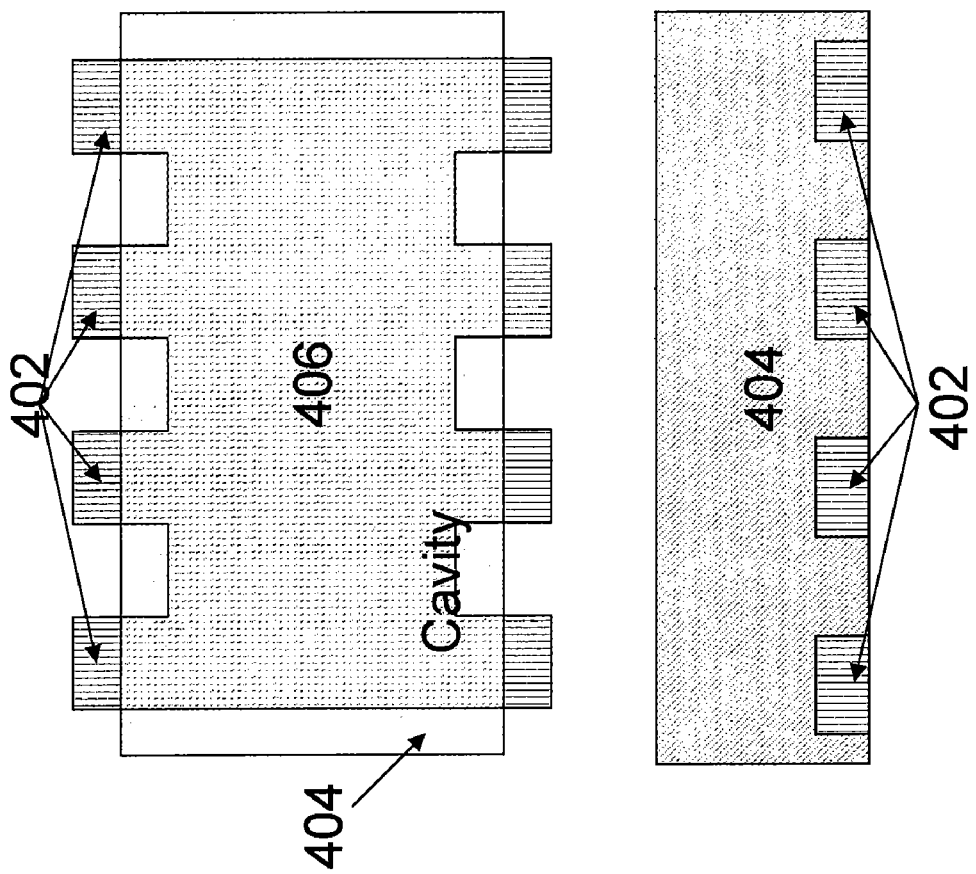
FIG. 4A represents line-of-site release tab structures having full height sacrificial layers in accordance with an embodiment of the present invention.

FIG. 4A shows top and cross-sectional views of the release tabs 402 in accordance with one embodiment of the present invention. As can be seen, the release tabs 402 may be of a height equal to the height of both sacrificial layers and extend from the cavity 406. As explained below however, thinner release channels can also be created. The release tabs 402 extend beyond the sidewalls of the encapsulating layer 404. In the embodiment shown in FIG. 4A, the release tabs 402 are substantially straight such that there is a direct line of sight path from the release tabs 402 to the cavity 406.

FIG. 4B shows another release tab 412 configuration, where the channels 418 extending from the release tabs 412 to the cavity 416 are dog-legged or zig-zagged in shape. Again, the release tabs 412 extend from the sidewalls of the encapsulating layer 414. This design will impede the line-of-site of the release channel 418, thereby helping to seal the cavity 416 without sealing material being deposited on the device contained therein. As shown by the dashed line, there is no line of sight path from the release tabs 412 to the cavity 416. Thus, when the cavity 416 is sealed after the sacrificial layers are removed, any molecules of the sealing material may be prevented from reaching the cavity 416. The molecules of the sealing layer, during deposition, may travel in a substantially linear path without scattering and thus deposit on the walls leading to the cavity 416 rather than within the cavity 416 itself.

FIG. 4C shows a single sided, multi tab 422 release channels 428 extending from the cavity 426 through the sidewalls of the encapsulating layer 424 in accordance with another embodiment of the present invention. FIG. 4D shows a dual ended release tab 432 extending through the sidewalls of the encapsulating layer 434 to the cavity 436 in accordance with another embodiment of the present invention.

FIGS. 5A and 5B show additional release channel configurations. In FIGS. 5A and 5B, the release channels 502, 512 formed through the sidewalls of the encapsulating layers 506, 516 are blocked by deposited metal layers 504, 514, 518. These metal layers 504, 514, 518 effectively reduce the height of the release channels 502, 512. The metal layers 504, 514, 518 reduce the opening of the release channels 502, 512 and thus reduce the amount of sealing material that may deposit within the release channels 502, 512 and cavity during the second encapsulating layer deposition. This configuration can be achieved by having a single layer (FIG. 5A) or multiple layers (FIG. 5B) of metal which are blanket deposited, patterned, and etched during the fabrication flow. The metal layers 504, 514, 518 may be formed by blanket depositing a metal layer, depositing a photoresist layer thereon, exposing the photoresist, developing the photoresist, removing the developed (or undeveloped photoresist) to form a mask, and then exposing the metal layers 504, 514, 518 through the mask to an etchant to remove undesired portions of the metal layers 504, 514, 518. Thereafter, the mask may be removed. The benefit of the metal layers 504, 514, 518 is that after the sacrificial layers have been removed, the material used for the sealing layer may not enter into the cavity. The metal layers 504, 514, 518 make the entrance into the cavity smaller and reduce the amount of material that may enter the cavity. If material enters into the cavity, it may adversely affect the performance of the device contained therein.

Figure 6:
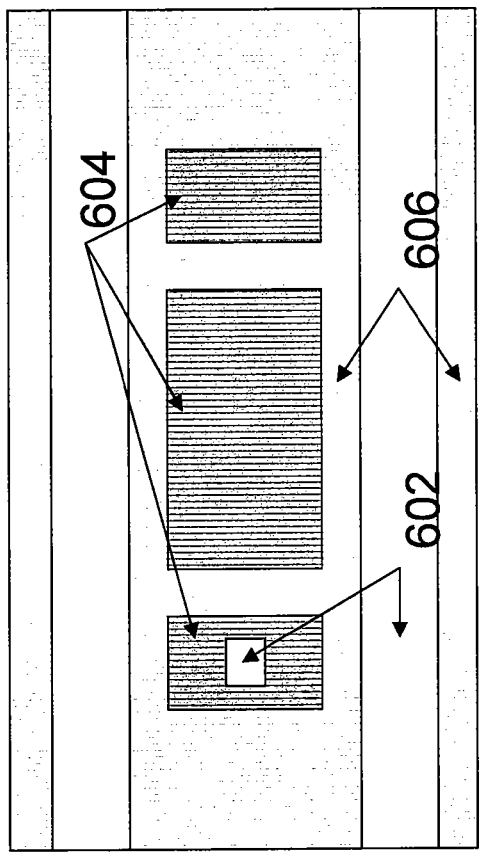
FIG. 6 represents the formation of a channel in the bottom sacrificial layer at the same time as the patterning of the interconnect via, in accordance with one embodiment of the present invention.

FIG. 6 shows another release channel configuration where the height of the release channel has been controlled by removal of material from the release channel itself. A guard ring trench 602 is etched into the structure during the patterning of the interconnect via between the landing electrodes 604 and the cantilever in the lower sacrificial layer 606. The trench 602 is etched to remove the lower sacrificial layer in the region of the subsequent release channels underneath the cap metal. Thereafter, the second sacrificial layer is deposited in the trench 602. Thus, the trench 602, which will serve as the release channel, is as thick as the second sacrificial layer rather than both the first and second sacrificial layers. The smaller thickness decreases may reduce the amount of encapsulating material that enters into the cavity when the cavity is sealed.

For the above method of micro-encapsulation to work, the sacrificial layer must be able to be selectively etched with respect to the embedded cantilever and encapsulation material. In a preferred embodiment, the cantilever, electrodes and encapsulation materials are selected from the group of materials comprising Al, Cu, Ti, TiN, Ta, TaN, Ru, Pt, WN, WNC or any combination thereof. The potential sacrificial layers which can be used are Si, SiN (using a Fluorine plasma based release etch), organic, polyimide, amorphous-Carbon (using a Hydrogen or Oxygen plasma based release etch) or $SiO_2$ (using a wet HF etch or vapor HF release etch). In some cases, the encapsulation layer can be made from another material, for example, $SiO_2$, in which case a $SiO_2$ sacrificial layer cannot be used.

In an embodiment where the cantilever switch or cantilever based memory element consists of a multiple time programming (MTP) device, the release layer may be deposited in multiple steps to form a sacrificial layer at the bottom and top of the cantilever. As discussed above, the height of the release channel may be determined by the total thickness of the sacrificial layers deposited (i.e., both top and bottom layers). In some embodiments, the bottom sacrificial layer can be patterned to anchor or connect the cantilever to the underlying metal. In other embodiments, small contact bumps may be formed by performing a multi-step deposition of the sacrificial layer with an intermediate patterning step between depositions. During the patterning of these sacrificial layers, the sacrificial layer in the release channel can also be patterned and etched without incurring any extra mask cost or complexity. This allows thinner release channels to be used. As will be appreciated, thinner release channels will help the sealing process.

FIGS. 7A-7F represent the formation of release channels in accordance with one embodiment of the present invention. Initially, a first sacrificial layer 704 is deposited over a substrate 702 and then a via 706 is formed through the sacrificial layer 704. The sacrificial layer 704 may be deposited by a spin-on process. The via 706 may be formed by conventional patterning and etching as described above. Thereafter, a second sacrificial layer 708 may be deposited over the first sacrificial layer 704. A via 710 may be formed in the second sacrificial layer 708. Then, after a cantilever has been deposited, a third sacrificial layer 712 may be deposited. A fourth sacrificial layer 714 may also be deposited over the third sacrificial layer 712. A via 716 may be formed in the third sacrificial layer 712 prior to depositing the fourth sacrificial layer 714. The sacrificial layers 704, 708, 712, 714 may then be patterned and an encapsulating layer 720 may be deposited thereon so that a plurality of release channels 718A-718D are formed of varying height.

Thus, in one embodiment, there may be a total of M sacrificial layers that are used to define the shape of the cavity where M is 2 or greater. However, the height of the release tabs may be less than the height of the cavity. For instance, the release tabs may be formed by N sacrificial layers extending out from the cavity where N is less than M.

FIGS. 8-11 show the results of a different aluminum BEOL cavities which can be implemented using the above discussed embodiments. The MEMS devices used in these examples are all cantilever devices. As will be appreciated however, other MEMS/NEMS devices can be added and connected to surrounding interconnects, as required. Examples of other MEMS/NEMS devices include, but are not limited to, resonators, gyroscopes, accelerometers and pressure sensors.

Figure 8:
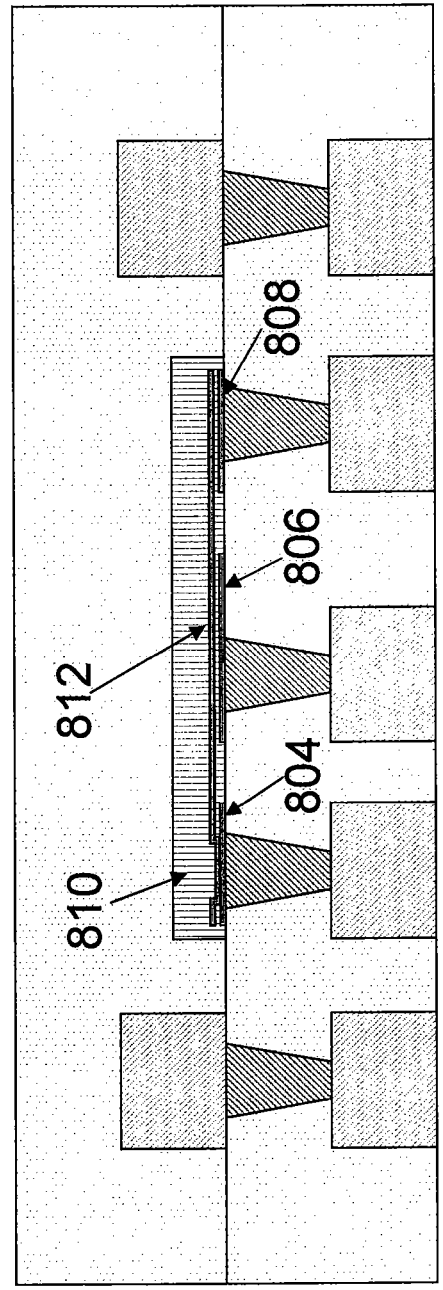
FIGS. 8-11 represent structures which can be implemented using the method of the present invention.
Figure 7A:
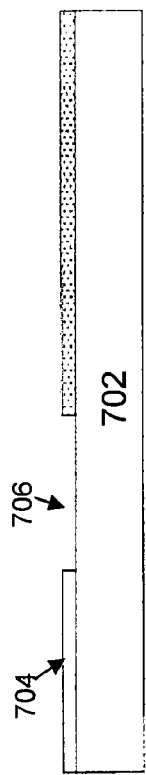
FIGS. 7A-7F represent the formation of release channels in accordance with one embodiment of the present invention.
Figure 7B:
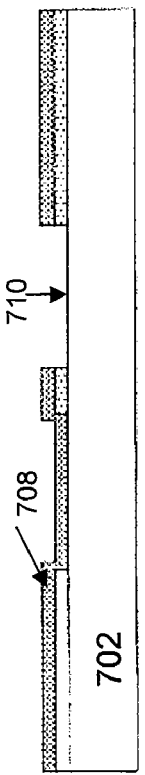
Figure 7C:
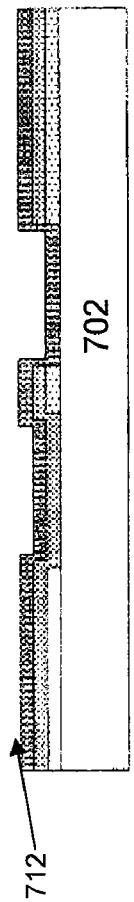
Figure 7D:
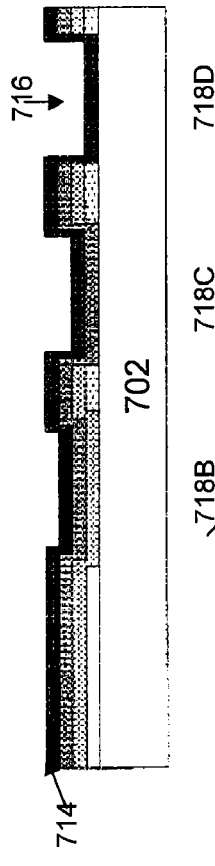
Figure 7E:
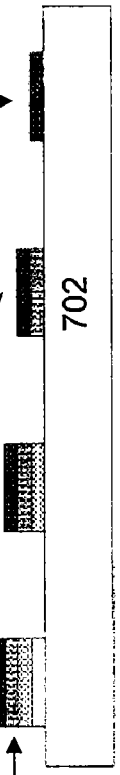
Figure 7F:
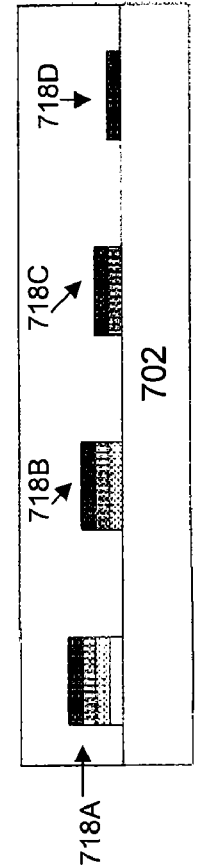

FIG. 8 shows a cantilever 812 in contact with a first electrode 804 and movable between a position in contact with a second electrode 808 and a position away from the second electrode 808. A third electrode 806 is also present within the cavity 810.

Figure 9:
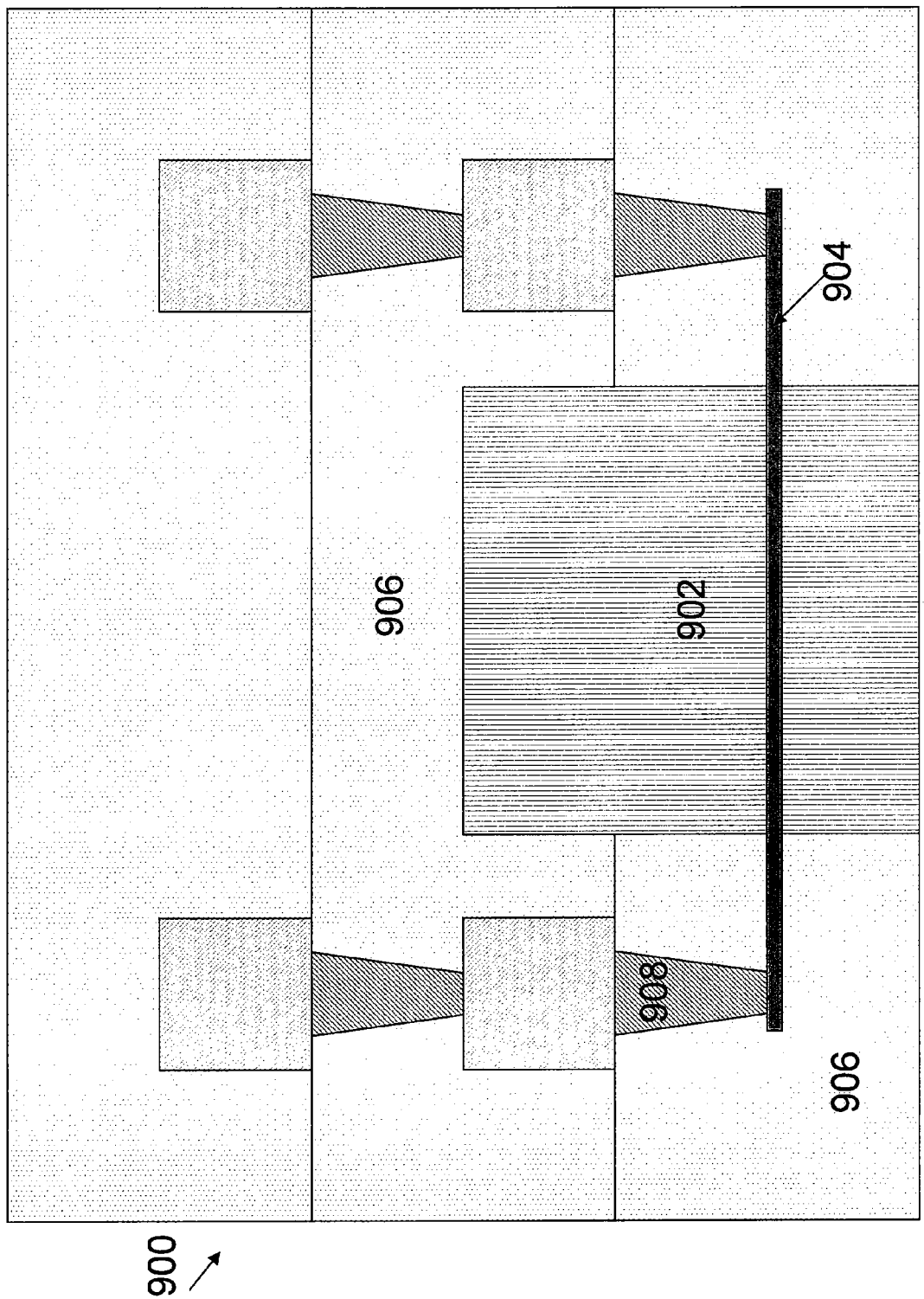

FIG. 9 shows a structure 900 having a cavity 902 that extends to a height greater than a single dielectric layer 906. An element 904, may connect vias 908 through the cavity 902. The element 904 may be a MEMS device. The cavity 902 may have a height greater than a single dielectric layer 906 to permit bigger elements 904 to be within the cavity 902. Thus, the cavity 902 may span more than the height of a single dielectric layer 906. It is contemplated that the cavity 902 may span a height of one or more dielectric layers 906 and thus, one or more interconnect layers. Additionally, the device within the cavity 902 may be positioned to be either horizontally placed or vertically placed. By horizontally placed, it is understood that the device will lie in a plane substantially parallel to the substrate upon which the device is formed. By vertically placed, it is understood that the device will lie in a plan substantially perpendicular to the substrate upon which the device is formed.

Figure 10:
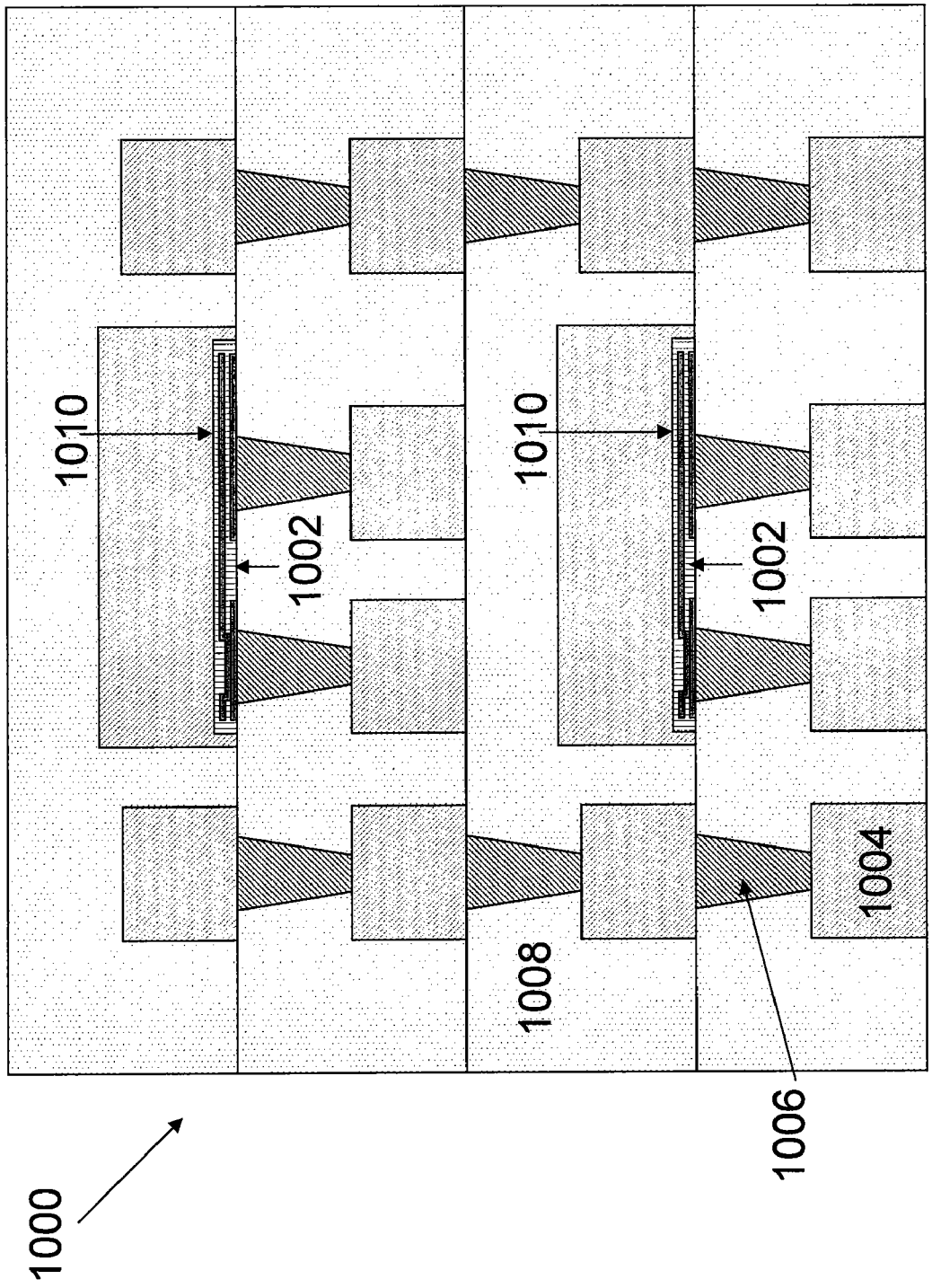

FIG. 10 shows a plurality of cavities 1002 within a structure 1000 having a plurality of metal interconnects 1004, vias 1006, and inter-metal dielectric layers 1008. The cavities 1002 may be encapsulated by a metal encapsulating layer 1010.

Figure 11:
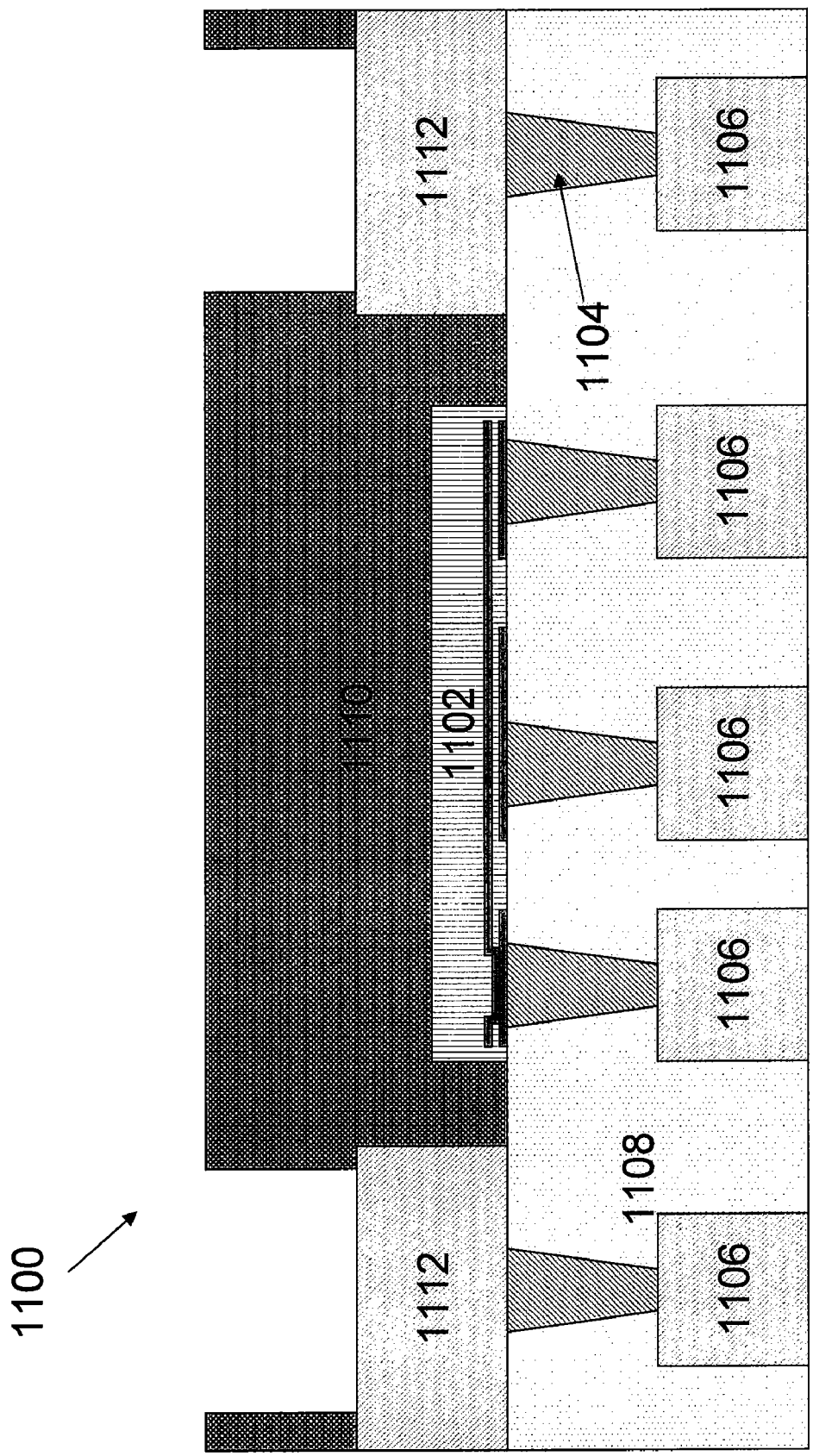

FIG. 11 shows a structure 1100 having a cavity 1102 formed above a plurality of vias 1104, interconnects 1106, and a dielectric layer 1108. The cavity 1102 may be encapsulated by a passivation layer 1110 such as silicon dioxide or silicon nitride. The passivation layer 1110 may be adjacent to a plurality of bond pads 1112.

Now, with reference to FIGS. 12A-12G, another embodiment of the encapsulating method will now be described. The embodiment describes the fabrication of a micro-cavity in a 90 nm copper CMOS BEOL. As with the previous embodiment, this embodiment will be described using the formation of a cantilever device as an example of a MEMS device which may be encapsulated. As will be appreciated however, the embodiment described below is suitable for the encapsulation of any Cu BEOL technology node.

Figure 12A:
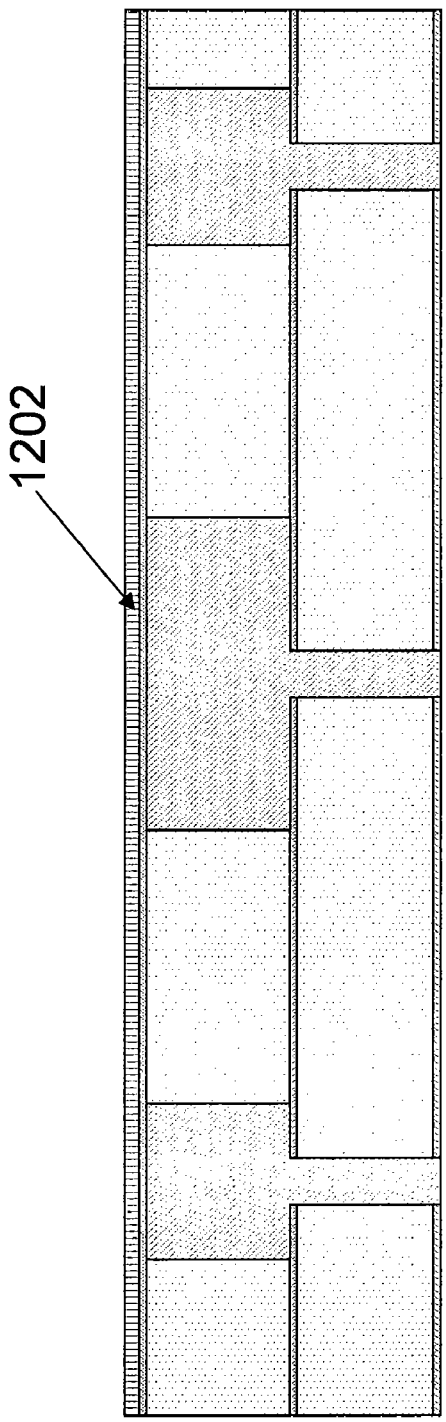
FIGS. 12A-12G represents an encapsulation method in accordance with an embodiment of the present invention.

FIG. 12A describes the first step of the method. More specifically, the first step comprises using normal CMOS process steps to fabricate a wafer up to a predetermined level within a copper CMOS BEOL. The step further comprises depositing a first sacrificial layer 1202. Similarly to the previous embodiment, the thickness of the sacrificial layer is chosen to permit correct operation of the enclosed MEMS device.

Figure 12B:
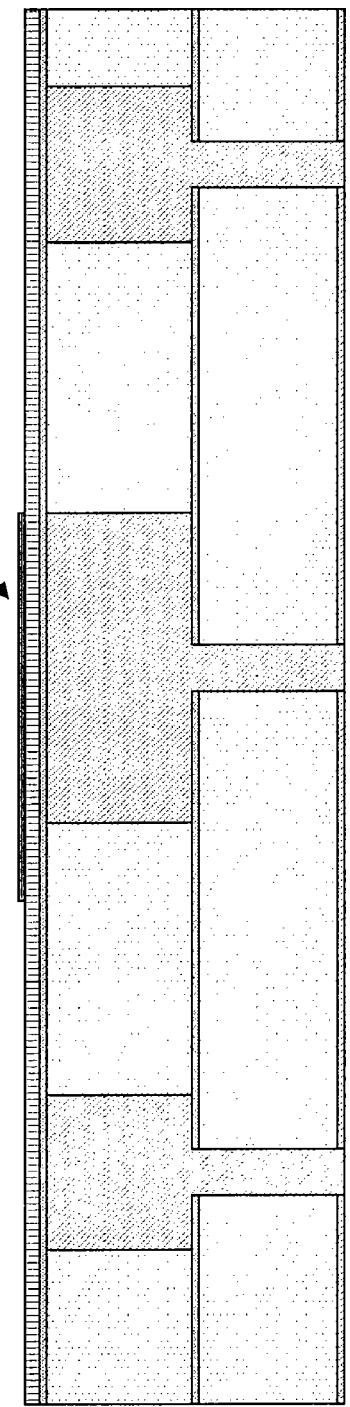

The result of the second step in the method is shown in FIG. 12B. In this step, a conductive layer is deposited over the lower sacrificial layer to form the cantilever 1204 of the cantilever device. In one embodiment, the conductive layer comprises titanium nitride. The conductive layer is then patterned using conventional lithography and etch processes in order to form the desired cantilever 1204.

Figure 12C:
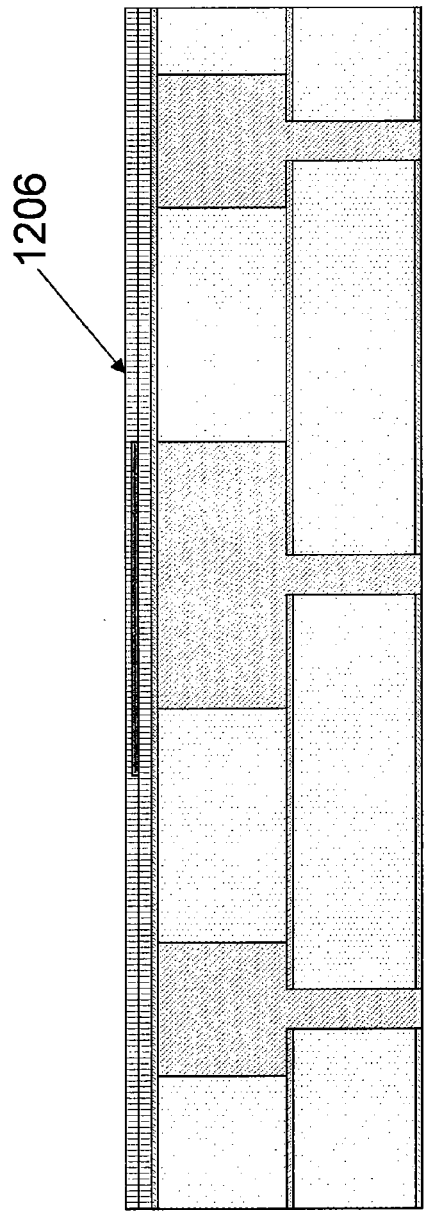

The third step in the method is shown in FIG. 12C. In this third step, a second sacrificial layer 1206 is deposited on the wafer surface over the patterned cantilever 1204. The coating of this second sacrificial layer 1206 effectively seals the MEMS element prior to the fabrication of the micro-cavity 1208.

Figure 12D:
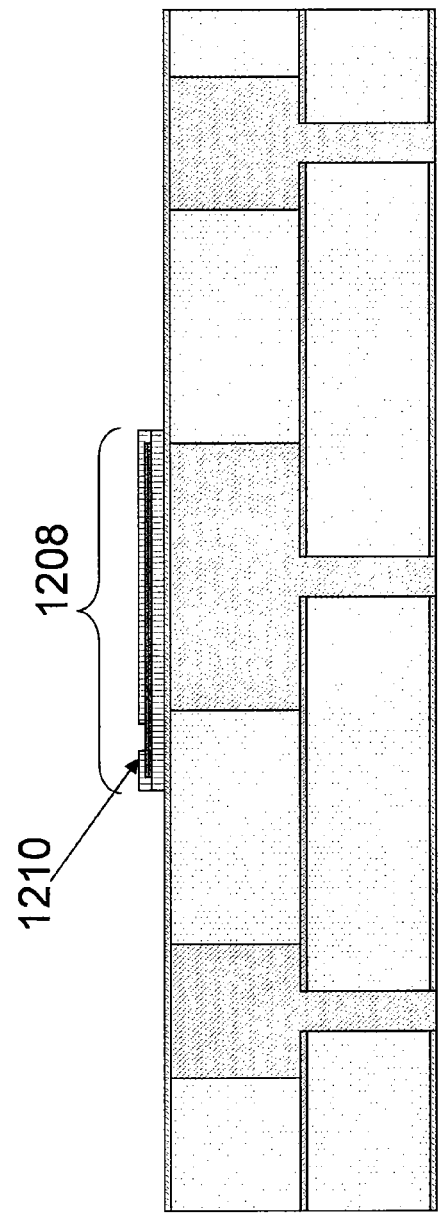

FIG. 12D shows the result of the fourth step of the method. In this step, a via structure 1210 is patterned in the upper sacrificial layer to form an interconnect from the underlying CMOS to the anchor point of the cantilever device.

Figure 12E:
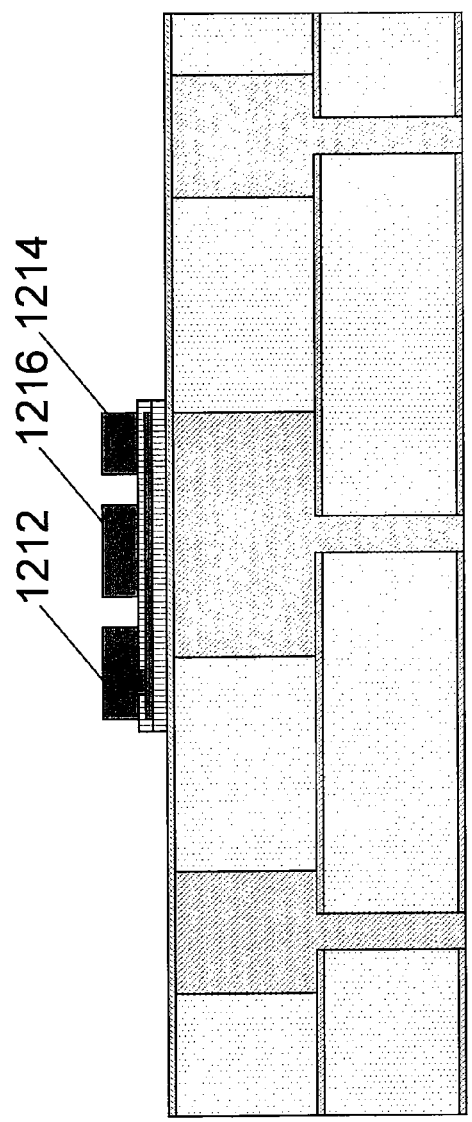

The result of the fifth step of the present invention is shown in FIG. 12E. This step comprises the formation of the anchor 1212 and electrode 1214 of the cantilever 1204. To this end, a thick layer of metal is deposited and then patterned and etched to form the required electrode areas for the device. An additionally electrode 1216 may also be present.

Figure 12F:
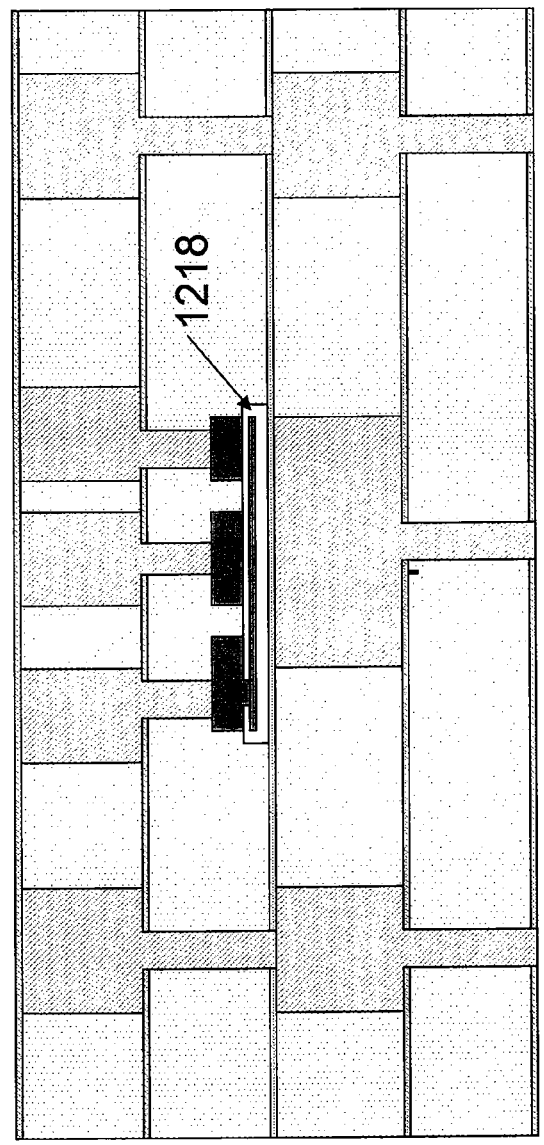
Figure 12G:
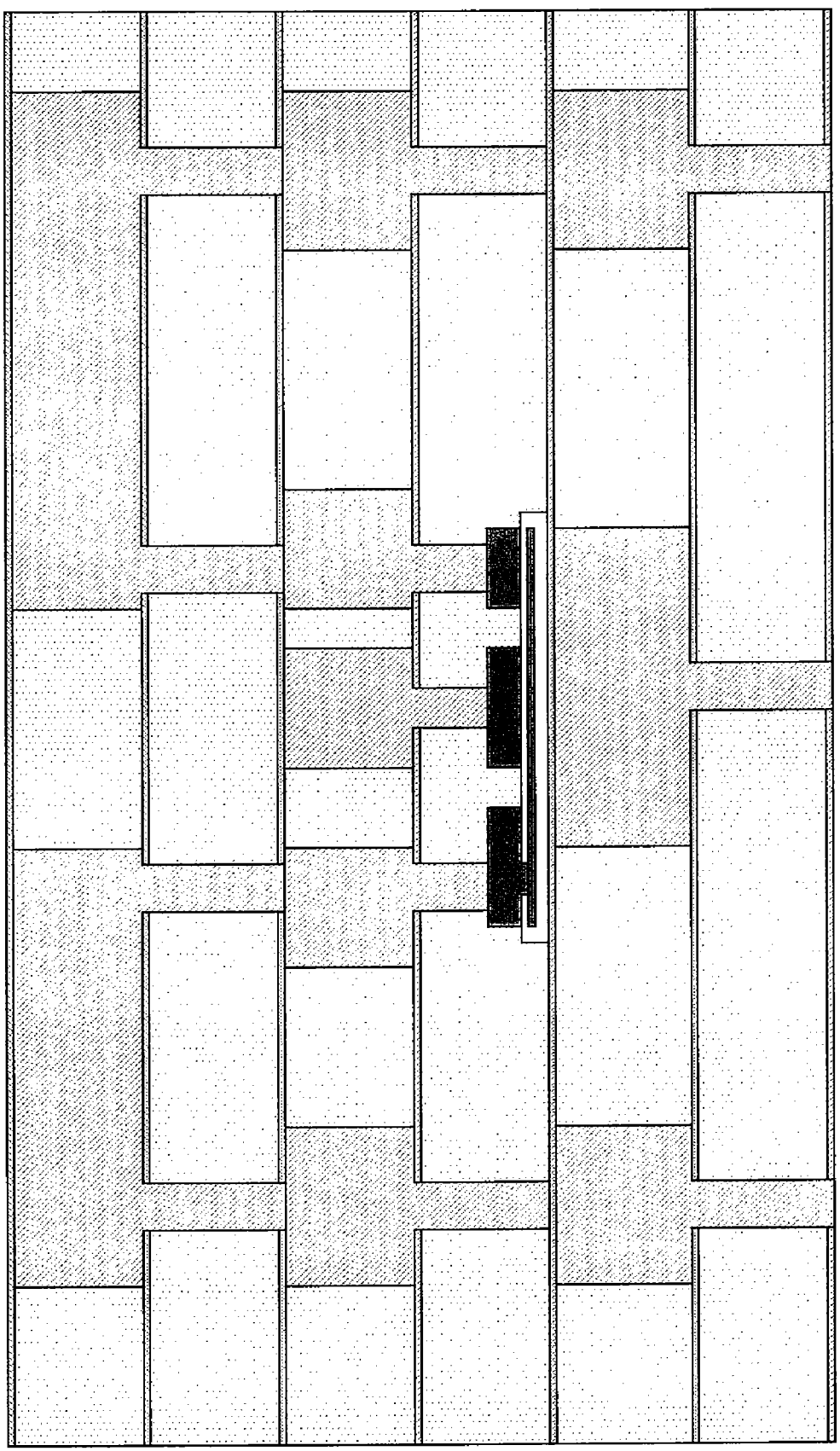

FIG. 12F shows the sixth step of the method in accordance with the present invention. In this step, a typical CMOS BEOL sequence is continued. The deposited IMD layers effectively seal the, as of yet, unreleased micro-cavity 1208 within the BEOL materials. Dual damascene interconnections are made to the electrodes patterned in the previous step in order to connect the device out to the underlying CMOS. Vias are then patterned and etched down to the buried micro-cavity sacrificial layer. The sacrificial layer is then removed by using a dry plasma etch to leave behind free standing MEMS element 1218. Then, the micro-cavity is effectively sealed with the deposition of the next interconnect IMD.

Figure 13:
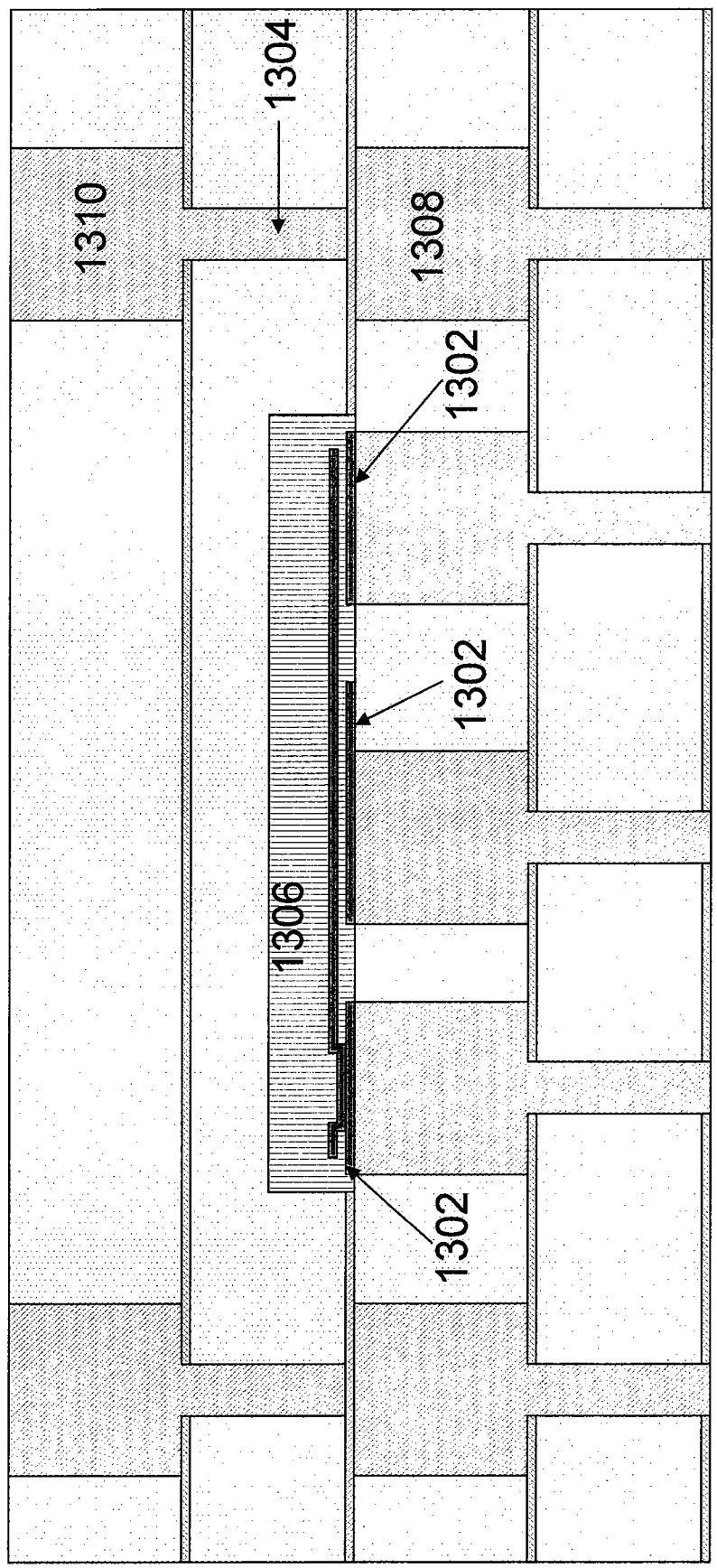
FIG. 13 represents another structure which can be implemented using the method of the present invention.
Figure 14:
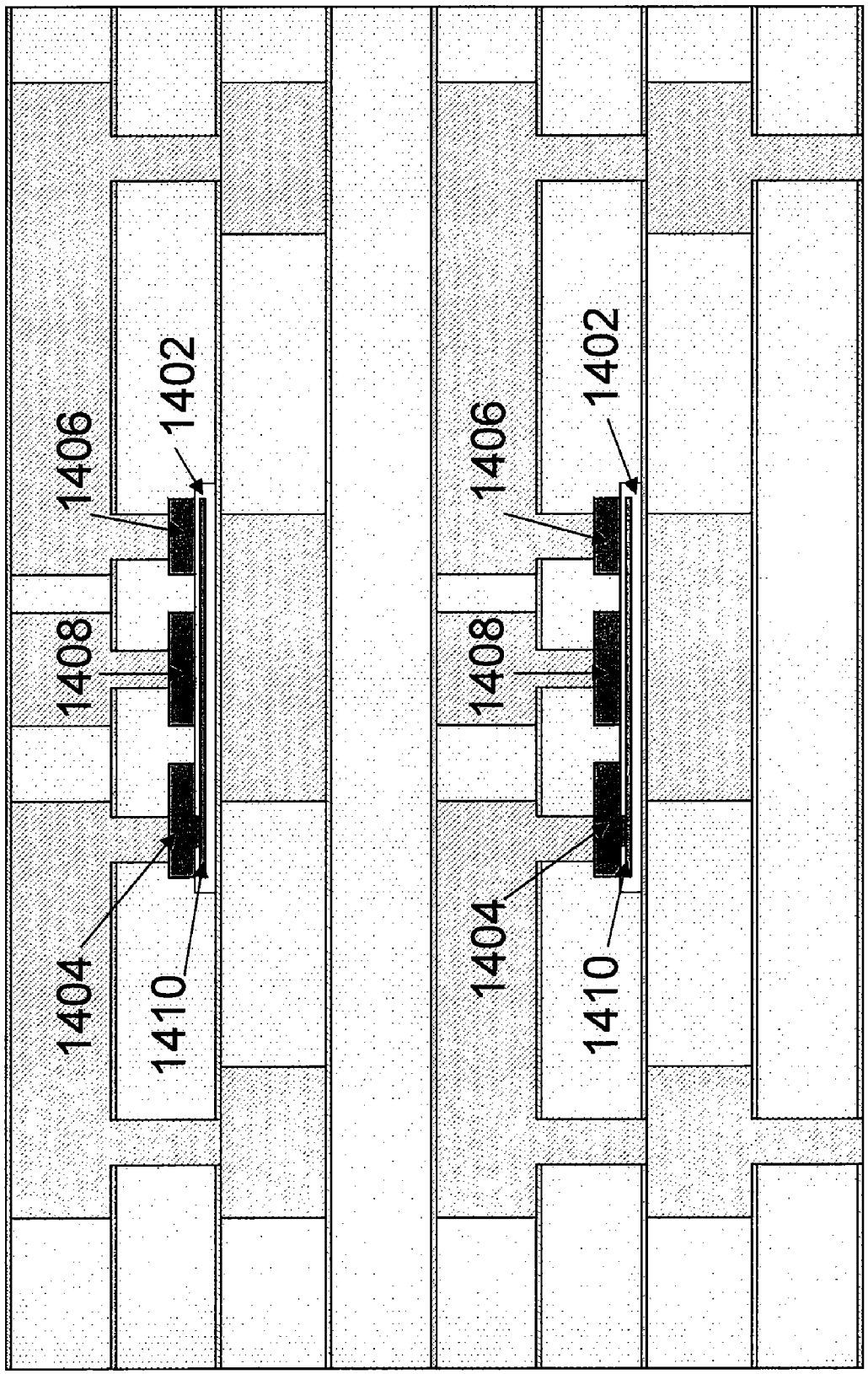
FIG. 14 represents another structure which can be implemented using the method of the present invention.

Other configurations for copper BEOL cavity implementations are shown in FIGS. 13 and 14. The MEMS devices used in these examples are all cantilever devices. As will be appreciated however, other MEMS/NEMS devices can be added and connected to surrounding interconnects, as required. Examples of other MEMS/NEMS devices include, but are not limited to, resonators, gyroscopes, accelerometers and pressure sensors. In FIG. 13, three electrodes 1302 are present in the cavity 1306. Additionally, a plurality of vias 1304 are present that connect the interconnects 1308 to the interconnects 1310 above the cavity 1306. FIG. 14 shows a plurality of cavities 1402 each with a cantilevers 1410. An anchor 1404 and a plurality of electrodes 1408, 1406 may be present.

While many of the embodiments discussed herein make reference to one device in a cavity, it is to be understood that multiple devices may be within a single cavity. The multiple devices may be capable of performing the same purpose or function that a single device may perform. The multiple devices may also be capable of performing different purposes or functions such that a plurality of devices within a same cavity. Additionally, it is to be understood that multiple devices placed within multiple cavities may be present with each device capable of performing the same or different function. Each of the cavities discussed herein may fit within the interlayer dielectric layer.

By patterning the sacrificial layers to form release tabs that extend beyond the sidewall of the encapsulating layer, additional masking steps to pattern and etch release holes through the top of the encapsulating layer are not necessary. The release tabs can be formed during the initial patterning of the sacrificial layers and encapsulating layer. Thus, a cavity may be formed in a more efficient manner according to the embodiments described herein.

While the foregoing is directed to embodiments of the present invention, other and further embodiments of the invention may be devised without departing from the basic scope thereof, and the scope thereof is determined by the claims that follow.

The invention claimed is:

1. A method of encapsulating a device, comprising:
depositing one or more sacrificial layers over a substrate, the one or more sacrificial layers forming a body substantially equivalent to a shape of a first cavity to be formed, the one or more sacrificial layers additionally having one or more release tabs extending from the body;
forming a device in the one or more sacrificial layers;
depositing a first encapsulating layer over the one or more sacrificial layers, the first encapsulating layer in contact with the substrate;
etching the first encapsulating layer to expose the one or more release tabs and to form a first encapsulating sidewall extending from a top of the first encapsulating layer to the substrate, the one or more release tabs extending beyond the first encapsulating sidewall;
removing the one or more sacrificial layers to form one or more openings between the first encapsulating layer and the substrate and the first cavity between the substrate, the first encapsulating layer, and the first encapsulating sidewall; and
depositing a second encapsulating layer over the first encapsulating layer to seal the opening, wherein the one or more sacrificial layers comprise a first sacrificial layer and a second sacrificial layer, the method further comprising:
etching the first sacrificial layer to expose an electrode of the substrate;
depositing a conductive layer over the first sacrificial layer and the electrode;
depositing the second sacrificial layer over the conductive layer and the first sacrificial layer; and
etching the second sacrificial layer.

2. The method of claim 1, wherein forming the device further comprises etching the conductive layer to form a cantilever, wherein etching the second sacrificial layer and the first sacrificial layer frees the cantilever.

3. A method of encapsulating a device, comprising:
depositing one or more sacrificial layers over a substrate, the one or more sacrificial layers forming a body substantially equivalent to a shape of a first cavity to be formed, the one or more sacrificial layers additionally having one or more release tabs extending from the body;
forming a device in the one or more sacrificial layers;
depositing a first encapsulating layer over the one or more sacrificial layers, the first encapsulating layer in contact with the substrate, wherein the first encapsulating layer comprises an electrically conductive material;
etching the first encapsulating layer to expose the one or more release tabs and to form a first encapsulating sidewall extending from a top of the first encapsulating layer to the substrate, the one or more release tabs extending beyond the first encapsulating sidewall;
removing the one or more sacrificial layers to form one or more openings between the first encapsulating layer and the substrate and the first cavity between the substrate, the first encapsulating layer, and the first encapsulating sidewall; and
depositing a second encapsulating layer over the first encapsulating layer to seal the opening.

4. The method of claim 3, wherein depositing the first encapsulating layer further comprises depositing the first encapsulating layer over an exposed electrode of the substrate.

5. The method of claim 4, wherein the one or more release tabs extend through the first encapsulating sidewall such that no line of sight path is present to the first cavity.

6. A method of encapsulating a device, comprising:
depositing one or more sacrificial layers over a substrate, the one or more sacrificial layers forming a body substantially equivalent to a shape of a first cavity to be formed, the one or more sacrificial layers additionally having one or more release tabs extending from the body;
forming a device in the one or more sacrificial layers;
depositing a first encapsulating layer over the one or more sacrificial layers, the first encapsulating layer in contact with the substrate;
etching the first encapsulating layer to expose the one or more release tabs and to form a first encapsulating sidewall extending from a top of the first encapsulating layer to the substrate, the one or more release tabs extending beyond the first encapsulating sidewall, wherein the one or more release tabs have a height that is less than a height of the first cavity;
removing the one or more sacrificial layers to form one or more openings between the first encapsulating layer and the substrate and the first cavity between the substrate, the first encapsulating layer, and the first encapsulating sidewall; and
depositing a second encapsulating layer over the first encapsulating layer to seal the opening.

7. A method of encapsulating a device, comprising:
depositing one or more sacrificial layers over a substrate, the one or more sacrificial layers having a body with a shape substantially equal to a cavity to be formed and one or more release tabs extending from the body;
forming a device within the one or more sacrificial layers;
depositing a first encapsulating layer over the one or more sacrificial layers, the first encapsulating layer having a top surface and sidewalls extending between the top surface and a top surface of the substrate, the first encapsulating layer having one or more openings therethrough with at least one opening having a first release tab of the one or more release tabs extending therethrough and beyond a respective sidewall;
removing the one or more sacrificial layers to form the cavity between the top surface of the first encapsulating layer, the sidewalls of the first encapsulating layer, and the top surface of the substrate; and
depositing a second encapsulating layer over the first encapsulating layer to seal each of the at least one openings, wherein the one or more sacrificial layers comprises a first sacrificial layer and a second sacrificial layer, the method further comprising:
etching the first sacrificial layer to expose an electrode of the substrate;
depositing a conductive layer over the first sacrificial layer and the electrode;
depositing the second sacrificial layer over the conductive layer and the first sacrificial layer; and
removing the second sacrificial layer.

8. The method of claim 7, wherein forming the device further comprises etching the conductive layer to form a cantilever, wherein removing the second sacrificial layer and the first sacrificial layer frees the cantilever.

9. A method of encapsulating a device, comprising:
depositing one or more sacrificial layers over a substrate, the one or more sacrificial layers having a body with a shape substantially equal to a cavity to be formed and one or more release tabs extending from the body;
forming a device within the one or more sacrificial layers;
depositing a first encapsulating layer over the one or more sacrificial layers, the first encapsulating layer having a top surface and sidewalls extending between the top surface and a top surface of the substrate, the first encapsulating layer having one or more openings therethrough with at least one opening having a first release tab of the one or more release tabs extending therethrough and beyond a respective sidewall, wherein the first encapsulating layer comprises an electrically conductive material;
removing the one or more sacrificial layers to form the cavity between the top surface of the first encapsulating layer, the sidewalls of the first encapsulating layer, and the top surface of the substrate; and
depositing a second encapsulating layer over the first encapsulating layer to seal each of the at least one openings.

10. The method of claim 9, wherein depositing the first encapsulating layer further comprises depositing the first encapsulating layer over an exposed electrode of the substrate.

11. The method of claim 10, wherein the second encapsulating layer comprises one or more inter-metal dielectric layers.

12. A method of encapsulating a device, comprising:
depositing one or more sacrificial layers over a substrate, the one or more sacrificial layers having a body with a shape substantially equal to a cavity to be formed and one or more release tabs extending from the body, wherein the one or more release tabs have a height that is less than a height of the cavity;
forming a device within the one or more sacrificial layers;
depositing a first encapsulating layer over the one or more sacrificial layers, the first encapsulating layer having a top surface and sidewalls extending between the top surface and a top surface of the substrate, the first encapsulating layer having one or more openings therethrough with at least one opening having a first release tab of the one or more release tabs extending therethrough and beyond a respective sidewall;

removing the one or more sacrificial layers to form the cavity between the top surface of the first encapsulating layer, the sidewalls of the first encapsulating layer, and the top surface of the substrate; and depositing a second encapsulating layer over the first encapsulating layer to seal each of the at least one openings.

13. A method of encapsulating a device, comprising:

depositing a first sacrificial layer over a substrate;

forming a device on the first sacrificial layer;

depositing a second sacrificial layer over the device and the first sacrificial layer;

etching the second sacrificial layer and the first sacrificial layer to form a patterned first sacrificial layer and a patterned second sacrificial layer, the patterned first sacrificial layer and the patterned second sacrificial layer collectively comprising a body having a shape substantially equivalent to a shape of a cavity to be formed, at least one of the patterned first sacrificial layer and the patterned second sacrificial layer having one or more release tabs extending from the body;

depositing a first encapsulating layer over the patterned second sacrificial layer, the first encapsulating layer in contact with the substrate, and the patterned second sacrificial layer and the one or more release tabs;

etching the first encapsulating layer to expose a top surface of the one or more release tabs;

etching the patterned second sacrificial layer and the patterned first sacrificial layer to form the cavity between the first encapsulating layer and the substrate and one or more openings through the first encapsulating layer at an area corresponding to the one or more release tabs; and depositing a second encapsulating layer over the first encapsulating layer and the one or more openings to seal the cavity, the second encapsulating layer bordering the cavity.

14. The method of claim 13, further comprising:

etching the first sacrificial layer to expose an electrode of the substrate; and depositing a conductive layer over the first sacrificial layer and the electrode.

15. The method of claim 14, wherein forming the device further comprises etching the conductive layer to form a cantilever, wherein etching the patterned second sacrificial layer and the patterned first sacrificial layer frees the cantilever.

16. The method of claim 15, wherein the first encapsulating layer comprises an electrically conductive material.

17. The method of claim 13, wherein the second encapsulating layer comprises one or more inter-metal dielectric layers.

18. The method of claim 17, wherein the one or more release tabs have a height that is less than a height of the first cavity.

* * * * *